US007489259B2

(12) United States Patent
Savell

(10) Patent No.: US 7,489,259 B2
(45) Date of Patent: Feb. 10, 2009

(54) SAMPLE RATE CONVERTER AND METHOD TO PERFORM SAMPLE RATE CONVERSION

(75) Inventor: Thomas C Savell, Santa Cruz, CA (US)

(73) Assignee: Creative Technology Ltd., Singapore (SG)

( * ) Notice: Subject to any disclaimer, the term of this patent is extended or adjusted under 35 U.S.C. 154(b) by 5 days.

(21) Appl. No.: 11/832,258

(22) Filed: Aug. 1, 2007

(65) Prior Publication Data

US 2008/0034161 A1 Feb. 7, 2008

Related U.S. Application Data

(60) Provisional application No. 60/821,087, filed on Aug. 1, 2006.

(51) Int. Cl.
*H03M 7/00* (2006.01)

(52) U.S. Cl. .................... 341/61; 711/118; 713/169; 714/776

(58) Field of Classification Search .................. 341/61; 711/118, 123, 126, 147, 151; 702/195; 703/2; 704/2; 708/290; 358/1.8; 84/603; 700/94
See application file for complete search history.

(56) References Cited

U.S. PATENT DOCUMENTS 6,858,790 B2 * 2/2005 Rossum ....................... 84/603

* cited by examiner

*Primary Examiner*—Rexford Barnie
*Assistant Examiner*—Joseph Lauture
(74) *Attorney, Agent, or Firm*—Schwegman, Lundberg & Woessner, P.A.; Gregory J. Gorrie

(57) ABSTRACT

Embodiments of a sample rate converter and method for sample rate conversion are generally described herein. In some embodiments, an interpolation module calculates new digital samples for insertion into a digital sample ring, a cache module provides input digital samples of a digital sample stream to the interpolation module, and a control module maintains and provides state information to the interpolation module and the cache module. Based on pitch parameters, the control module provides the interpolation module a fractional portion of an address for use in calculating the new digital samples and provides the cache module with an integer portion of the address and an address increment.

20 Claims, 14 Drawing Sheets

US 7,489,259 B2

SAMPLE RATE CONVERTER AND METHOD TO PERFORM SAMPLE RATE CONVERSION

CROSS REFERENCE TO RELATED APPLICATIONS

This Patent Application claims priority to U.S. Provisional Patent Application Ser. No. 60/821,087, filed Aug. 1, 2006 entitled "METHOD AND DEVICE TO PERFORM SAMPLE RATE CONVERSION", the entire contents of which is incorporated by herein by reference.

TECHNICAL FIELD

Some embodiments of the present invention relate to digital signal sampling. Some embodiments of the present invention relate to sample rate conversion. Some embodiments of the present invention relate to digital audio systems.

BACKGROUND

Digital audio signals may are provided at many different sample rates. For example, digital audio on compact discs (CDs) is sampled at a frequency of 44.1 kHz, digital content is sampled at 32 kHz for satellite broadcasting, and so on. When processing these digital signals the sample rate of the digital signal is often changed.

BRIEF DESCRIPTION OF THE DRAWINGS

Example embodiments are now described, by way of example, with reference to the accompanying diagrammatic drawings. In the drawings.

DETAILED DESCRIPTION

A method and device to perform sample rate conversion of digital data is described. In the following description, for purposes of explanation, numerous specific details are set forth in order to provide a thorough understanding of the present invention. It will be evident, however, to one skilled in the art that the present invention may be practiced without these specific details.

In an example embodiment, a Sample Rate Converter (SRC) is provided that may perform sample rate conversion on, for example, 256-channels (e.g., audio or any other digital data). The SRC may implement one or more of the following: a wavetable synthesizer oscillator, a streaming audio direct memory access (DMA) playback engine, an on-chip sample-rate converter, an up/down sampler, an audio recording DMA engine, or the like. The SRC may, for example, be deployed in a digital processing device (e.g., VLSI chip) that employs a data path arranged in a ring configuration. Accordingly, prior to describing various example embodiments of the SRC, a description of an example digital processing device in which the SRC may be deployed as a sample rate conversion module is described. It should be noted that the deployment of the example embodiments described herein are not limited to embodiment using a ring configuration to transport data.

Figure 1:
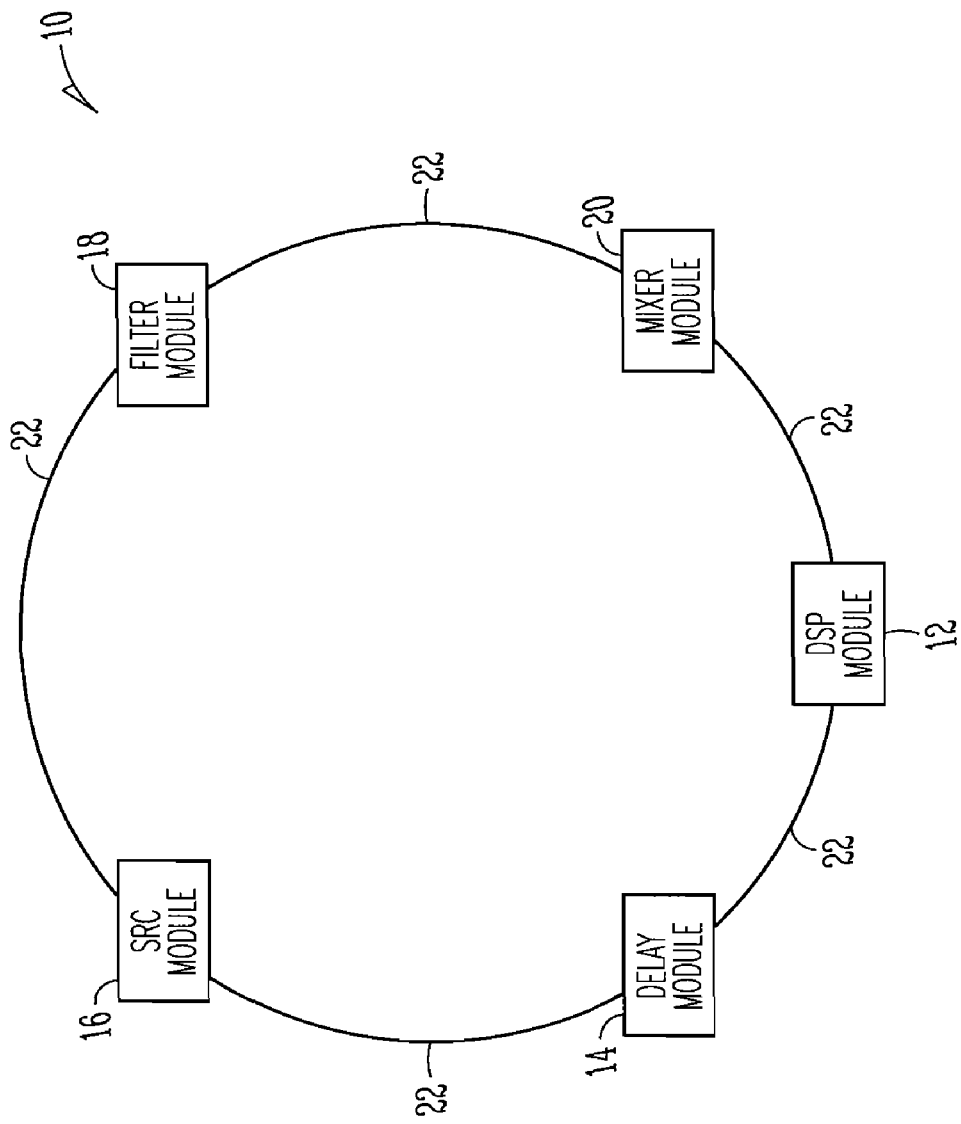
FIG. 1 shows a schematic block diagram of an example digital processing device, in accordance with an example embodiment, including a data path arranged in a ring configuration.

Referring to FIG. 1, reference numeral 10 generally indicates a schematic block diagram of an example digital processing device in accordance with an example embodiment. The device 10 is shown to include a plurality of processing modules, namely, a digital signal processing (DSP) module 12, a delay module 14, an SRC module 16, a filter module 18, and a mixer module 20. The modules 12 to 20 are interconnected serially via a data path 22 which is arranged in a ring configuration wherein data is sequentially communicated from any one processing module to any other processing module. Unlike conventional digital processing devices, the device 10 in accordance with an example embodiment allows each module 12 to 20 to communicate data with any other module 12 to 20 connected to the data path 22 as described in more detail below. In an example embodiment, the data path 22 is time division multiplexed wherein a routing controller controls communication of data between the various modules 12 to 20. Further, it is to be appreciated, that the modules 12 to 20 are merely example modules and further modules (with the same or differing processing capabilities) may be included in the device 10 and/or any one or more of the modules 20 may be removed and, for example, included within any other module 12 to 20.

Thus, in an example embodiment, any one of the modules 12 to 20 may communicate data to any one or more of the other modules 12 to 20 under control of a routing controller. Accordingly, data being processed by the digital processing device 10 may be flexibly routed between different modules 12 to 20 and need be not restricted to predetermined pathways as in the case of conventional devices. It will be appreciated that a module 12 to 20 and 34 may also communicate data back to itself via the audio bus 46. Accordingly, repeated processing may be performed on the data by the same processing module. The processing module 12 to 20 that provides the data to the data path 22 may be viewed as a source processing module, and the particular processing module 12 to 22 that is to process the data may be viewed as a target or destination processing module. As a processing module 12 to 20 may return processed data to itself, in one mode of operation a processing module 12 to 20 may define both the source and destination processing module. Thus, for example, the filter module 18 may form a cascaded filter arrangement where its output or processed data may be sent back to itself for further processing prior to being sent to another processing module 12 to 20 and 34.

Although, example embodiments are described with reference to processing a digital media stream in the form of a digital audio stream, it is however to be appreciated that the example embodiments may be applied to the processing of any other digital media streams, for example, digital video streams or the like.

Figure 2:
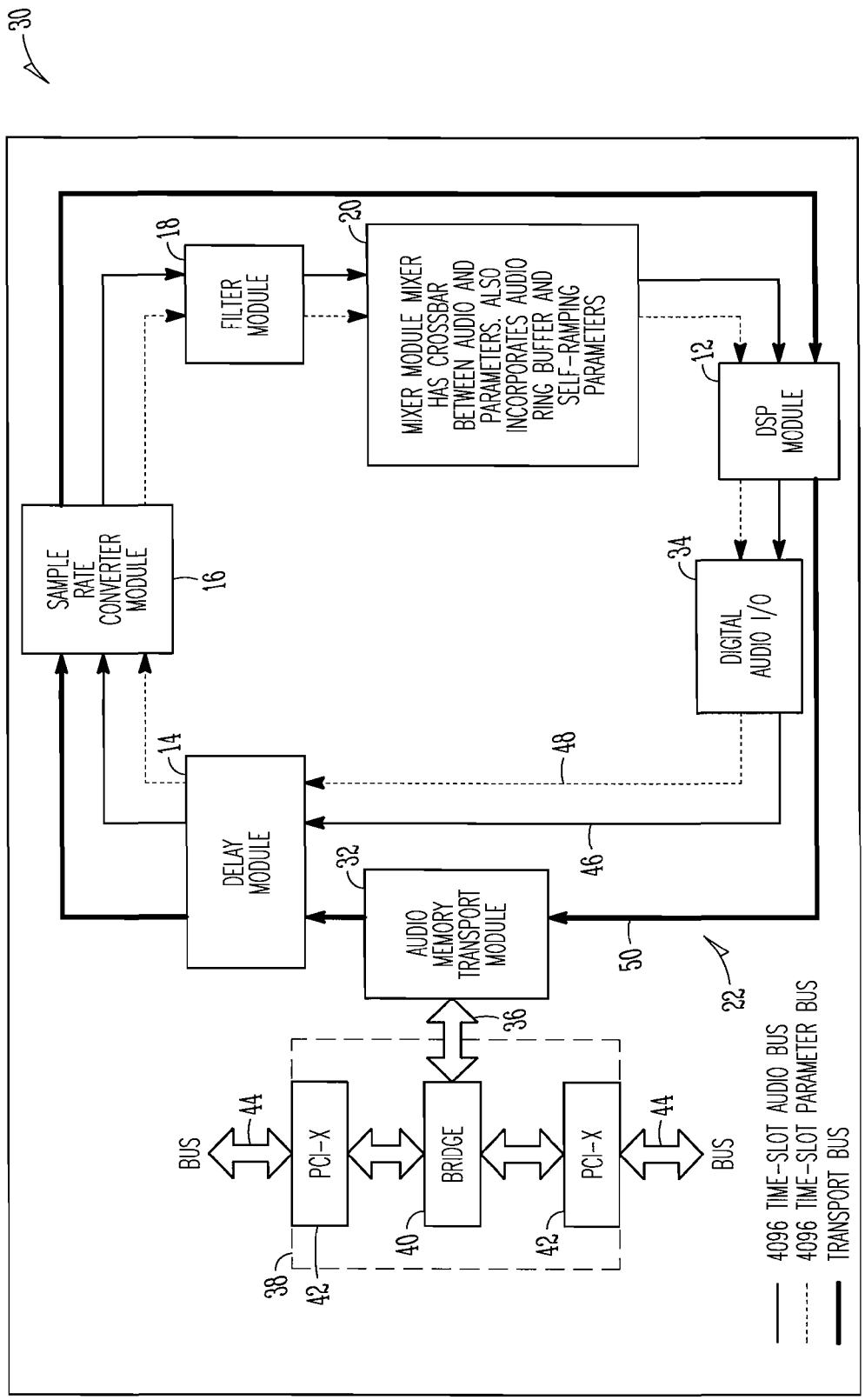
FIG. 2 shows a schematic block diagram of a further embodiment of a digital processing device, also in accordance with an example embodiment.

Referring in particular to FIG. 2 of the drawings, reference numeral 30 generally indicates a digital processing device in accordance with an example embodiment. The device 30 resembles the device 10 and, accordingly, like reference numerals have been used to indicate the same or similar feature unless otherwise indicated.

The device 30 includes a DSP module 12, a delay module 14, an SRC module 16, a filter module 18, and a mixer module 20 that are substantially similar to the modules described herein before. Further, the device 30 includes an audio memory transport module 32 and a digital audio input output (I/O) module 34. The audio memory transport module 32 communicates via a bus 36 with an interface module 38 which, for example, may form part of a bus of a computer device (for example a personal computer or PC). In an example embodiment, the interface module 38 includes a bridge 40 and two PCI-X bus interfaces 42 that interface the bridge 40 to a conventional PC bus 44. The digital I/O module 34 may receive a digital audio input and provide digital audio output to an output device. As in the case of the device 10, the device 30 includes a data path 22 which serially interconnects the modules 12, 34, 32 and 14 to 20.

The data path 22 of the device 30 includes a media data path in the example form of an audio data path or audio bus 46, and a processing control path in the example form of a parameter bus 48. In an example embodiment, both the audio bus 46 and the parameter bus 48 are arranged in a ring configuration wherein data is communicated between the various processing modules 12 to 20, 32, 34 in a time division multiplexed fashion. As the various modules are located along the audio bus 46, audio data may be routed between modules without requiring the data to be routed through a central hub (e.g., a DSP). In certain embodiments, the device 30 includes a transport bus 50 which interfaces an external computer via the interface module 38 and the audio memory transport module 32 to the processing modules 12 to 20.

In order to control the routing of data on the data path 22 (including, for example, the audio bus 46, the parameter bus 48 and the transport bus 50) the device 30, in certain embodiments, includes a routing controller 52 (see FIG. 3) which controls the routing of data along the data path 22. In particular, as generally indicated by reference numeral 54, in an example embodiment the routing controller 52 controls the routing of data to each processing module 12 to 20, 32, 34 via chip select lines 56 and address, write data, and write enable lines 58. Each module 12 to 20, 32, 34 communicates data to the routing controller 52 via read data and acknowledge lines 60. In an example embodiment, the routing controller 52 defines a host interface that uses a full synchronous handshake approach that interfaces the various processing modules 12 to 20, 32, 34 of the device 30. For example, the routing controller 52 may generate a chip select that is held active until an acknowledge signal is received from a selected processing module 12 to 20, 32, 34. In an example embodiment, the routing controller 52 decodes the most significant bits of a host address and, in response thereto, generates a chip select that enables the selected processing module 12 to 20, 32, 34. As described in more detail below, each module 12 to 20, 32, 34 may locally decode the remaining least significant bits of the host's address that are significant thereby to identify the specific module 12 to 20, 32, 34 to which data is to be routed.

Figure 3:
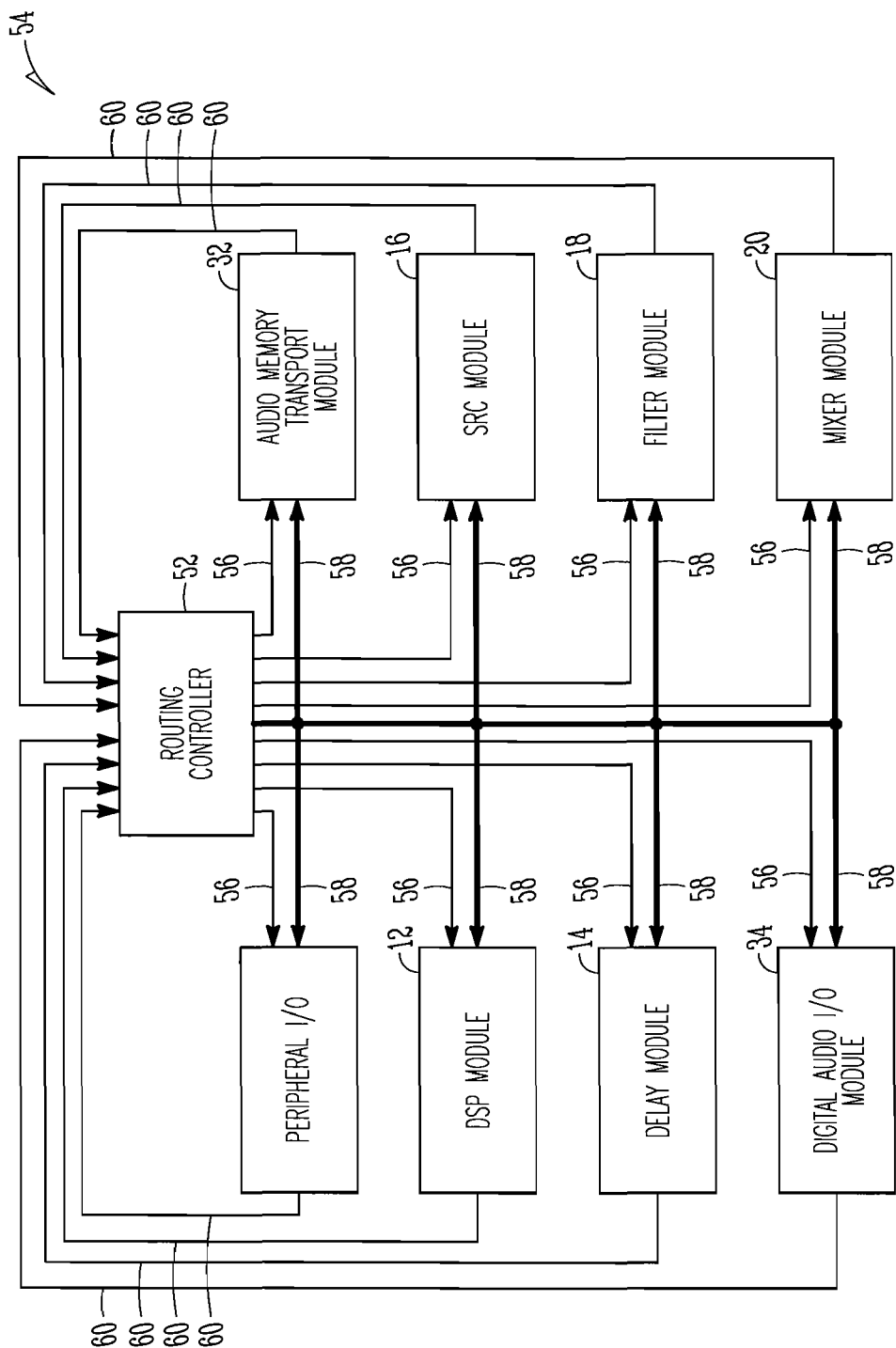
FIG. 3 shows a schematic block diagram of a routing controller, in accordance with an example embodiment, for routing digital data in the digital processing device of FIG. 2.

The example routing controller 52 of FIG. 3 uses a common data bus 58 to provide address, write data and write enable data to all of the processing modules 12 to 20, 32, 34. However, each module 12 to 20, 32, 34 includes a dedicated read data and acknowledge bus 60 for reading data and providing acknowledgements to the routing controller 52.

Figure 4:
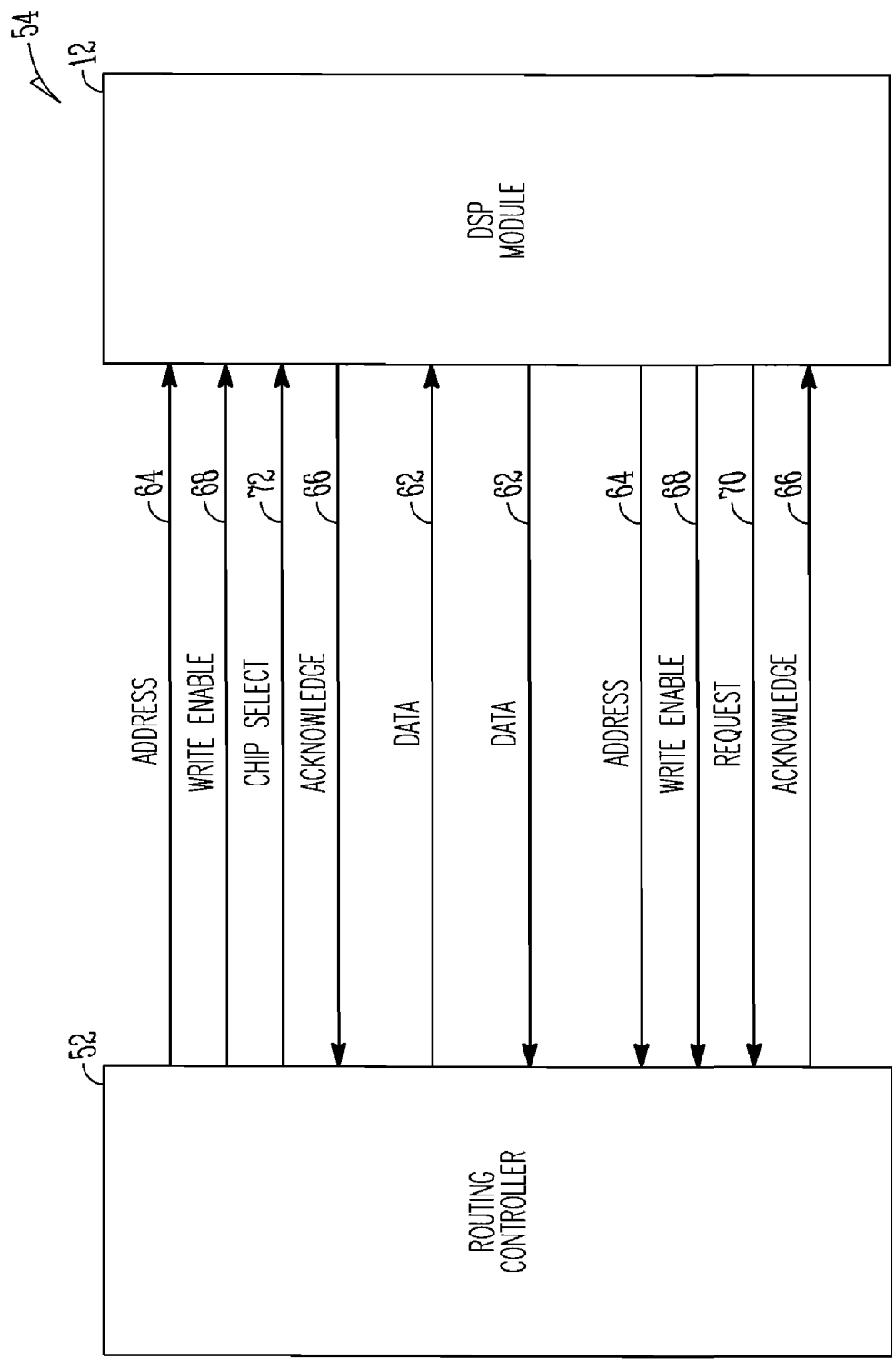
FIG. 4 shows a schematic block diagram of an example interface between a routing controller and a digital signal processor (DSP) of the digital processing device.

In an example embodiment, the DSP module 12 is interfaced to the routing controller 52 in such a fashion so that the DSP module 12 has access to registers and random access memory (RAM) provided in each of the modules 14 to 20, 32, 34. In particular, as shown in FIG. 4, the DSP module 12 may communicate with the routing controller 52 via a data bus 62, an address bus 64, acknowledge lines 66, write enable lines 68, a request line 70 and a chip select line 72. In order to access registers and RAM that may be provided in the modules 14 to 20, 32, 34, the DSP module 12 communicates a request via line 70 to the routing controller 52. The routing controller 52 may then acknowledge the request via the acknowledge line 66 where after the requested functionality may be executed using the address bus 64 and data bus 62.

In embodiments in which a sample rate tracker is provided within the digital audio I/O module 34, it may also be interfaced to the routing controller 52 thereby providing access to registers and/or RAM in the modules 12 to 20, 32. In an example embodiment, the routing controller 52 treats requests from the DSP module 12 (and one or more sample rate trackers if provided) as equivalent to host processor accesses using a first come first served priority scheme. However, if the requests arrive at the same time, the requests may be sorted. For example, the routing controller 52 may first route requests to the DSP module 12, then to the sample rate trackers provided in the digital audio I/O module 34 and, finally, to a host processor. In an example embodiment, the device 30 has two base address registers, one mapped to I/O and the other mapped to memory. Both of these registers may be active simultaneously and, both address registers may allow access to the same internal registers and memories of a chip on which the device 30 is provided.

In an example embodiment, the audio bus 46 provides audio channels that are time division multiplexed. Each processing module 12 to 20, 32, 34 may have a fixed output time-slot allocated to it and a programmable or variable input time-slot. Thus, in this embodiment, the modules 12 to 20, 32, 34 may always output data in the same predetermined time-slot to the audio bus 46 but receive data in different time-slots under control of the routing controller 52. Thus, as the input time-slot associated with each individual module 12 to 20, 32, 34 is programmable, data may be routed between the various modules 12 to 20, 32, 34 in a flexible fashion. As described in more detail below, a channel identification bus may be provided to identify the module 12 to 20, 32, 34 with which the time-slot is associated. In an example embodiment, the channel identification bus identifies a source processing module 12 to 20, 32, 34 and a target or destination processing module 12 to 20, 32, 34 includes a list to identify data sources from which data is to be processed. However, it will be appreciated that the channel identification may also identify a target processing module 12 to 20, 32, 34.

In certain embodiments, the device 30 allows digital data (e.g., digital audio data) to be communicated along the audio bus 46 at differing sample rates (e.g., sample rates set by the DSP module 12). For example, in an example embodiment, 4096 buffer channels or time-slots are provided on the audio bus 46. In this example configuration, the audio bus 46 may then support sample rates of up to 384 kHz by allocating one time-slot for 48 kHz, two time-slots for 96 kHz, four time-slots for 192 kHz, and eight time-slots for 384 kHz. Thus, since there are 4096 total channels or time-slots in the given sample, only 2048 channels or time-slots are available at 96 kHz, 1024 time-slots available at 192 kHz, and 512 time-slots are available at 384 kHz. It is, however, to be appreciated that the number of time-slots for each sample rate at any given time during operation of the device 30 may vary and, for example, situations could arise where, for example, 3348 48 kHz time-slots are provided, 204 96 kHz time-slots are provided, and 85 192 kHz time-slots may be provided. However, the various configurations (e.g., bit-rates) or numbers of time-slots may vary depending upon the functionality to be executed by the device 30. For example, in other embodiments programmable operating clock frequencies may be provided. For example, clock frequencies of 150 MHz, 175 MHz, and 200 MHz may be provided that correspond to 3072, 3584, and 4096 time-slots respectively. It is, however, to be appreciated that these are merely examples of frequencies and time-slots and that they may change from embodiment to embodiment. Thus, in an example embodiment, the media data path may include a total number of time-slots for communicating media data at a plurality of different bit rates wherein the sum of a number of time-slots allocated to each one of the plurality of bit rates equals the total number of time-slots.

In certain embodiments, arbitrary sample rates, such as the CD standard of 44.1 kHz, may be communicated or routed via the audio bus 46 using a indicator bit (e.g. a valid bit) that indicates to a receiving module 12 to 20, 32, 34 that a new valid sample is to be retrieved or extracted from the audio bus 46 for processing. When an arbitrary sample rate (such as the 44.1 kHz sample rate) is communicated via the audio bus 46, and the example valid bit is high, the respective module 12 to 20, 32, 34 may accept the data as valid. Whereas, when the valid bit goes low, the module 12 to 20, 32, 34 is thereby informed that the subsequent samples may be disregarded.

Although in an example embodiment variable sample rates may be communicated via the audio bus 46, the parameter bus 48 may communicate control data at a fixed sample rate (e.g. 48 kHz) that may be independent of the sample rate of the audio bus 46.

In an example embodiment, the audio bus 46 communicates audio data to be processed by the various modules 12 to 20, 32, 34. However, the parameter bus 48 includes parameter or processing data which is used by an associated module 12 to 20, 32, 34 to define the functionality (e.g., algorithm) of the associated module 12 to 20, 32, 34. Accordingly, the control data may thus control how the data on the audio bus 46 will be processed by the particular module 12 to 20, 32, 34. For example, the parameter bus 48 may be used to communicate filter parameters to the filter module 18, sample rate conversion parameters to the sample rate converter module 16, delay data to the module 14 that defines the period by which the digital audio will be delayed, and so on. It will thus be appreciated that, in order to reduce any processing latencies in the device 30, the parameter data should be provided to each of the processing modules 12 to 20, 32, 34 prior to the time slot which each particular processing module 12 to 20, 32, 34 is to output processed audio data. Accordingly, as described in more detail below, parameter data is communicated via the parameter bus 48 to a particular processing module 12 to 20, 32, 34 prior to the audio data arriving at the processing module 12 to 20, 32, 34 via the audio bus 46.

In an embodiment, audio data communicated via the audio bus 46 is in 32-bit IEEE floating-point format (single precision). Any module placed on the data path 22 that operates in a fixed-point format (e.g., fixed-point audio) may thus be required to perform a conversion to and from floating-point format. As the fixed-point format is defined to be in a range of −1 to +1, any hardware conversion of the fixed-point format will saturate floating-point values that lie outside this range. Accordingly, the mixer module 20 may be used to scale any digital data that is placed on the data path 22 for any processing module that performs fixed-point conversion so that the conversion lies within the range of −1 to +1. For example, in an example embodiment, the sample rate converter module 16 and the digital audio I/O module 34 may process data in a fixed-point format and, accordingly, scaling may then be required by the mixer module 20.

Figure 5:
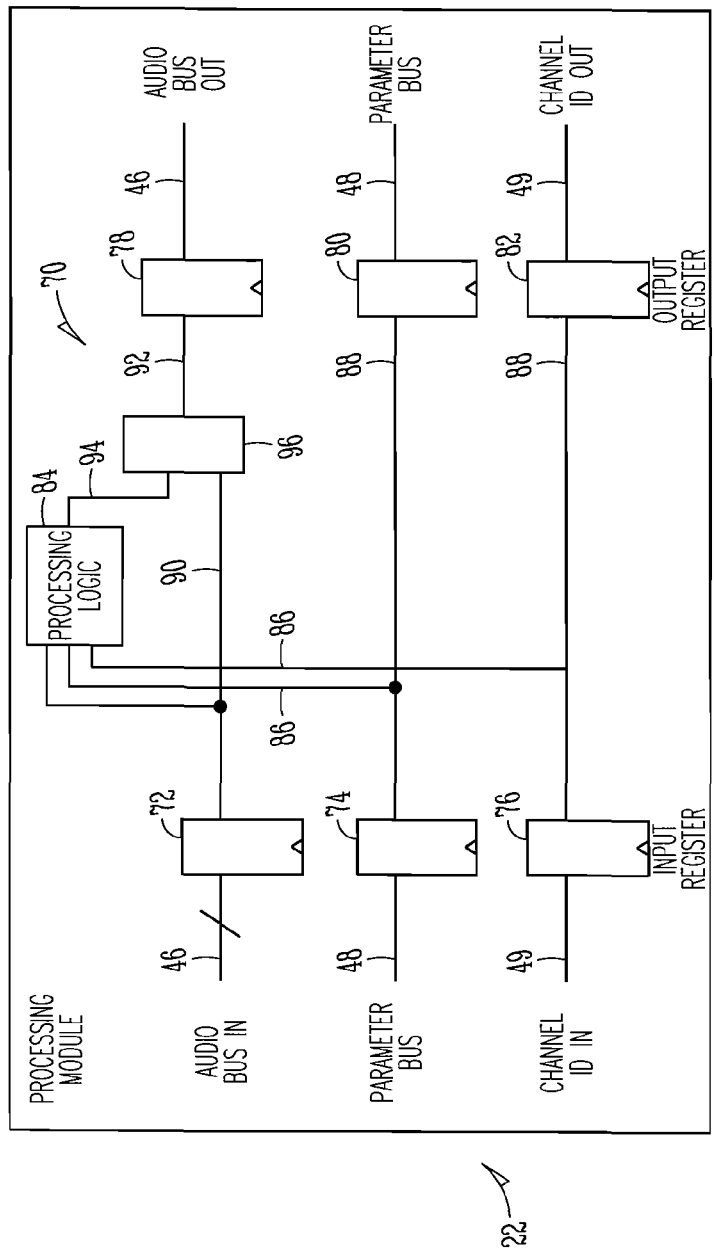
FIG. 5 shows a schematic block diagram of a processing module interface, according to an example embodiment.

Referring in particular to FIG. 5, reference numeral 70 generally indicates an example data path interface provided in each processing module 12 to 20, 32, 34. It will also be appreciated that the data path interface 70 may be provided in any further processing modules that may be added in a modular fashion to the device 30 to communicate via the data path 22. When the data path 22 includes a media data path in the form of the audio bus 46, a processing control path in the form of the parameter bus 48, and a channel identification bus 49, the interface 70 may include input registers 72, 74, 76 which clock all inputs on the data path 22 into the respective processing module 12 to 20, 32, 34 for processing. In a similar fashion, output registers 78, 80, 82 clock data back onto the data path 22. Dedicated processing logic 84 is provided in each processing module 12 to 20, 32, 34 to process the digital data, received via the audio bus 46, in accordance with the parameters received via the parameter bus 48. The functionality of the processing logic 84 differs from module to module. For example, the processing logic in the filter module 18 may define a plurality of filters (e.g., IIR and FIR filters), the processing logic 84 in the sample rate converter module 16 may define a sample rate converter, and so on.

In the embodiment depicted in the drawings, the channel identification data included in the channel identification bus 49, and the parameter data provided by the parameter bus 48, is read by the processing logic 84 as shown by lines 86 and passed on or returned to the channel identification bus 49 and the parameter bus 48, respectively, two clocks later (as shown by lines 88). However, audio data provided by the audio bus 46 may be either passed directly on to the audio bus 46 (as shown by lines 90, 92) or be replaced with processed audio data from the processing logic 84 (as shown by lines 94 and 92). Accordingly, the data path interface 70 may include a multiplexer 96 that selects between the data received via the audio bus 46 and the processed data received from the processes logic 84. Thus, when a particular processing module 12 to 20, 32, 34 is not the target processing module 12 to 20, 32, 34 and it receives data, the processing module 12 to 20, 32, 34 may merely pass the data along the communicating ring to the next processing module 12 to 20, 32, 34. Accordingly, the data may be passed on sequentially until it reaches the target processing module 12 to 20, 32, 34. It will be appreciated that the data passed along may form part of a stream of media data that is being processed. Likewise, streams of processing control data may be passed along the parameter bus 48.

Figure 6:
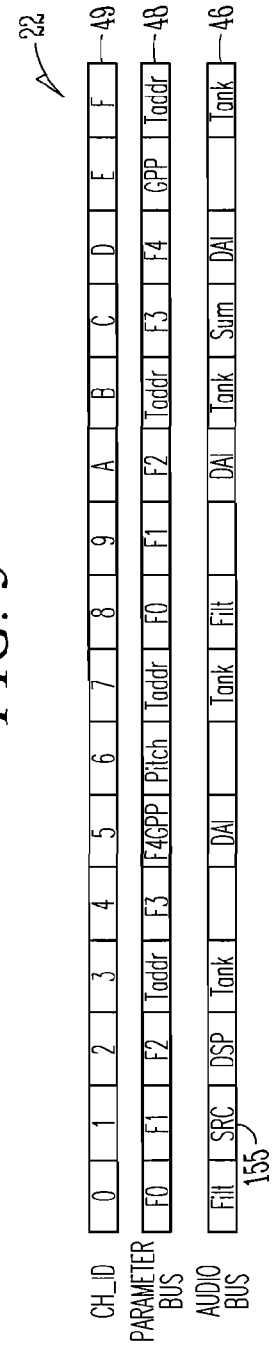
FIG. 6 shows an example time-slot location arrangement of the data path of FIG. 2.

Referring in particular to FIG. 6, an example configuration of the data path 22 is shown. As mentioned above, in an example embodiment, the data path 22 includes the audio bus 46, the parameter bus 48, and the channel identification bus 49. The channel identification bus 49 may include channel identifiers that identify both the channels or time-slots provided on the parameter bus 48 and the channels or time-slots provided on the audio bus 46. However, it is to be appreciated, that separate channel identifiers may be provided for the audio bus 46 and the parameter bus 48. For example, embodiments may be provided wherein the audio bus 46 and the parameter bus 48 each have their own channel identification bus. In an example embodiment, each channel identifier is in the form of a hexadecimal number generated by a counter which has its count included in the channel identification bus 49.

Example parameter definitions provided on the parameter bus 48 (see FIG. 6) may be as follows:

$F_x$=filter parameters 0 to 4 for the filter module 18;
Pitch=pitch of the sample rate converter module 16;
GPP=general purpose parameters to be used by the modules 12 to 20, 32, 34; and
Taddr=delay line address of the delay module 14.

Example audio channel or time-slot definitions are as follows:

FILT=outputs from the filter module 18 (e.g., of an IIR filter);
DSP=outputs of the DSP module 12;
SRC=outputs of the sample rate converter module 16;
SUM=summation node outputs of the mixer module 20;
DAI=digital audio inputs from the I/O module 34; and
Tank=data outputs from the delay module 14.

In an example embodiment, as mentioned above, the least significant two, three, or four bits of the channel identification data may be used to identify the specific processing module 12 to 20, 32, 34 associated with a particular time-slot and, accordingly thus identify the particular time-slot (or time-slots) that the processing module 12 to 20, 32, 34 owns. However, the most significant bits may be used to identify a logical channel or time-slot within the particular processing module. For example, a filter module that can process 512 discrete channels of audio implements a plurality of 512 discrete filter channels, each requiring its own set of filter parameters, and each providing its own discrete filtered audio output. In an example embodiment that contains such a filter module, the most significant 9 bits of the channel identification data may determine to which filter channel the filter parameters belong, and which filter channel generated the audio.

In an example embodiment, the channel identification data provided via the channel identification bus 49 is generated in the mixer module 20. As mentioned above, the channel identification data may define a channel identifier that may be generated by a counter that runs from 0 to 4095 wherein each number identifies, or is associated with, a particular channel or time-slot. Further, as mentioned above, in order to ensure that parameters arrive at the appropriate processing module 12 to 20, 32, 34 prior to the time-slot in which they are to output processed audio data, the data on the parameter bus 48 may be offset relative to data provided on the audio bus 46.

In an example embodiment, software may program the mixer module 20. The software may then take into account that a module 12 to 20, 32, 34 requires a certain amount of time to operate on incoming parameters (via the parameter bus 48) and to generate the processed audio data which it then outputs on the audio bus 46. In these embodiments, the appropriate parameters for the processing module 12 to 20, 32, 34 are provided in a time-slot that precedes the time-slot in which the module outputs the audio data on audio bus 46. As different processing modules 12 to 20, 32, 34 may require different parameters and times to process the parameters and audio, parameters associated with different processing modules 12 to 20, 32, 34 may be offset by a differing number of time-slots. For example, an example offset of 96 may be provided for the sample rate converter module 16, an example parameter offset of 40 may be provided for the filter module 18, and an example parameter offset of 20 may be provided to the delay module 14. It is, however, to be appreciated that the offsets may differ from embodiment to embodiment and also differ in a single embodiment depending on the functionality or algorithm that the modules 12 to 20, 32, 34 are to perform or execute.

In certain embodiments, it is necessary to buffer the audio data received via the audio bus 46. In particular, phase coherency is a requirement for multi-channel audio data to avoid phase cancellation and image shifting. Phase coherency is simplified by buffering a full sample period of audio data. A processing module may then process guaranteed phase coherent audio from its local audio buffer without respect to the relative intra-sample timing of data arrival and data processing. It may not be necessary to buffer all channels received via audio bus 46, only those that are to be processed. To implement phase coherency, a ping-pong buffer scheme can be used in which at least two buffers, "A" and "B", alternate in usage from write to read. During the first sample period, the received audio data may be written to buffer "A" while the processing module reads from buffer "B". At a certain time, the buffers may swap functions so that during the next sample period, the received audio data is written to buffer "B" while the processing module reads from buffer "A". In certain embodiments, the delay module 14, the filter module 18, and the mixer module 20 may change or swap audio buffers synchronized with their respective channel processing times. For example, data path or audio ring input buffers of the delay module 14 may swap when the delay module 14 channel equals zero, e.g., when the delay module 14 begins to generate the audio it will output to the audio bus 46 when the most significant bits of the channel identification are equal to zero. This may occur when the data path or audio ring channel or time-slot equals the maximum channel identification minus the parameter offset of the delay module 14. If the parameter offset is equal to 20, this delays the last 20 audio ring channels or time-slots by an extra sample period relative to the other ring channels or time-slots from the perspective of the delay module 14. Likewise, in the case of the filter module 18, the last 40 audio ring channels or time-slots may be delayed by an extra sample period to the filter module 18. In certain embodiments, the mixer module 20 may delay the last 18 audio ring channels or time-slots. However, in an example embodiment, the sample rate converter module 16 may write audio ring data directly into its channel caches and, accordingly, relative delay problems may not be experienced.

As mentioned above, output time-slots (time-slots in which each processing module 12 to 20, 32, 34 outputs data onto the audio bus 46) are dedicated time-slots. However, in certain embodiments, the time-slots in which data is communicated to any one of the processing modules 12 to 20, 32, 34 is programmable and, thus, the channel identification data identifies the particular processing module 12 to 20, 32, 34 that is to process the audio data on the audio bus 46. In an example embodiment, the parameter bus 48 has its input time-slots allocated. Further, in certain embodiments, the mixer module 20 may provide the parameters that are communicated to the various processing modules 12 to 20, 32, 34 via the parameter bus 48. Accordingly, not only can data be flexibly routed from any one of the processing modules 12 to 20, 32, 34 to any other one or more processing modules 12 to 20, 32, 34 but, in a similar fashion, parameters may be flexibly routed to any of the processing modules 12 to 20, 32, 34. In an example embodiment, the DSP module 12 can overwrite parameters on the parameters bus 48 thereby allowing the DSP module 12 direct control of the functionality executed or performed by the delay module 14, the sample rate converter module 16, the filter module 18, and the mixer module 20 (or any other modules added to the data path 22).

Figure 7:
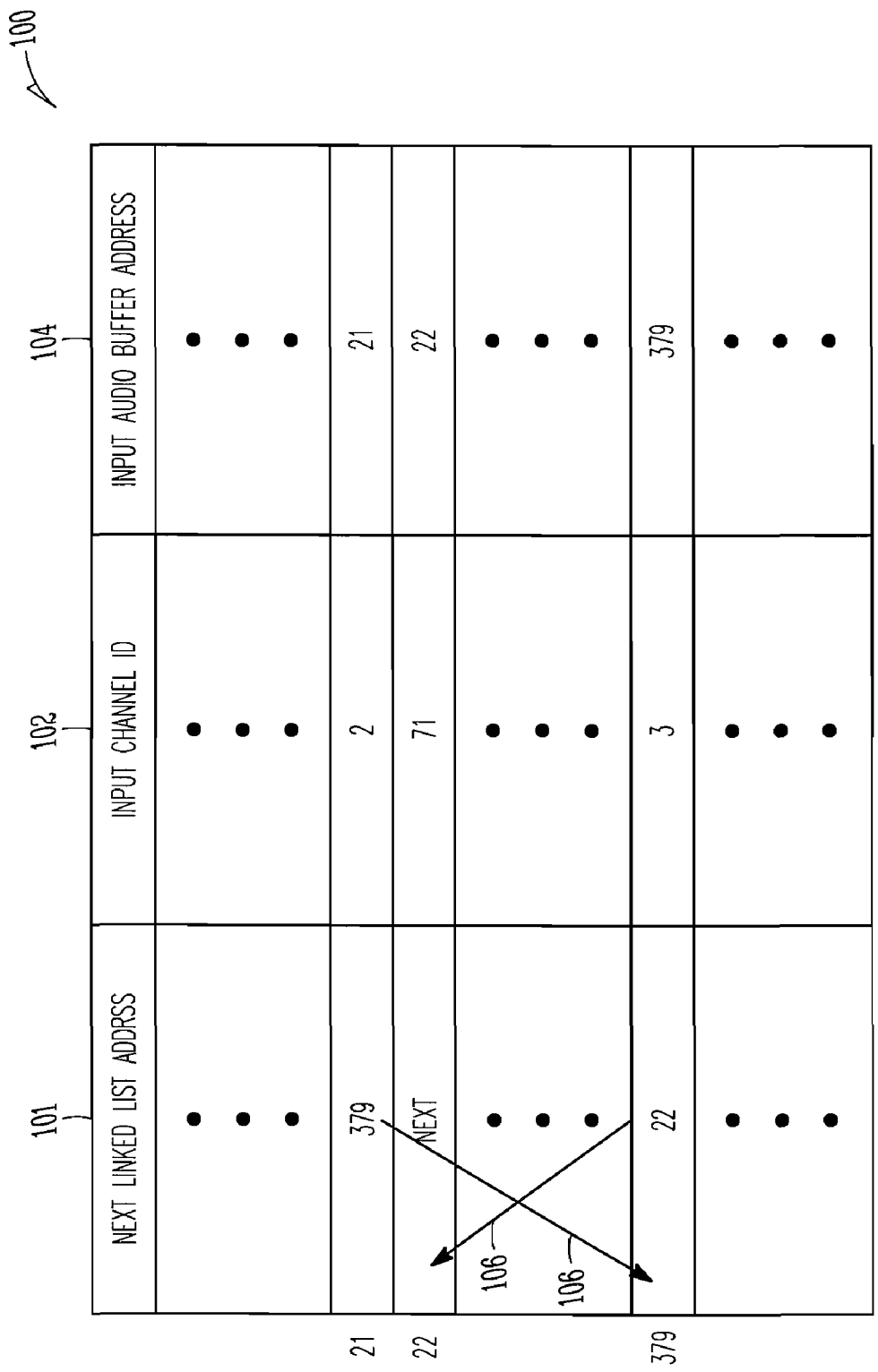
FIG. 7 shows an example linked list of an input mapper.

As mentioned above, data included in the audio bus 46 and parameters included in the parameter bus 48 may be flexibly routed to the processing modules 12 to 20, 32, 34. In an example embodiment, an input mapper in the form of a linked list 100 (see FIG. 7) is provided. In this embodiment, the routing controller 52 (see FIG. 3) performs programmable input mapping to flexibly route audio data to the various processing modules 12 to 20, 32, 34. In use, the input mapper may traverse a linked list 100 of input channel identifiers 102 and input RAM addresses 104 to determine which input channels are written to which addresses within the input audio buffer. In an example embodiment, the linked list 100 is used and the list is arranged or sorted in an order of ascending channel identifiers regardless of the input audio buffer address, as shown by arrows 106. A host software driver may maintain the list 100.

The input mapper may, in use, load the first element in the linked list 100 which may include the input channel identifier 102, the input audio buffer address 104 and appoint it to the next element in the list. The input mapper then waits until the input channel identifier on the channel identification bus 49 matches the input channel identification field 102 and then writes the input audio data received via audio bus 46 to the designated input audio buffer address. The element of the linked list 100 designated by the next linked list address field 101 may then be loaded and the operation may be repeated. The linked list 100 may be maintained in a circular fashion so its last element points to its first element of the linked list 100. On reset, for example, a default input mapping list may be automatically written by hardware initialization logic and host driver software may merely be required to maintain the linked list 100. If multiple filters are provided by the filter module 18, an additional level of mapping may be provided to support multiple filters operating on the same input signal or data provided via the audio bus 46.

Figure 8:
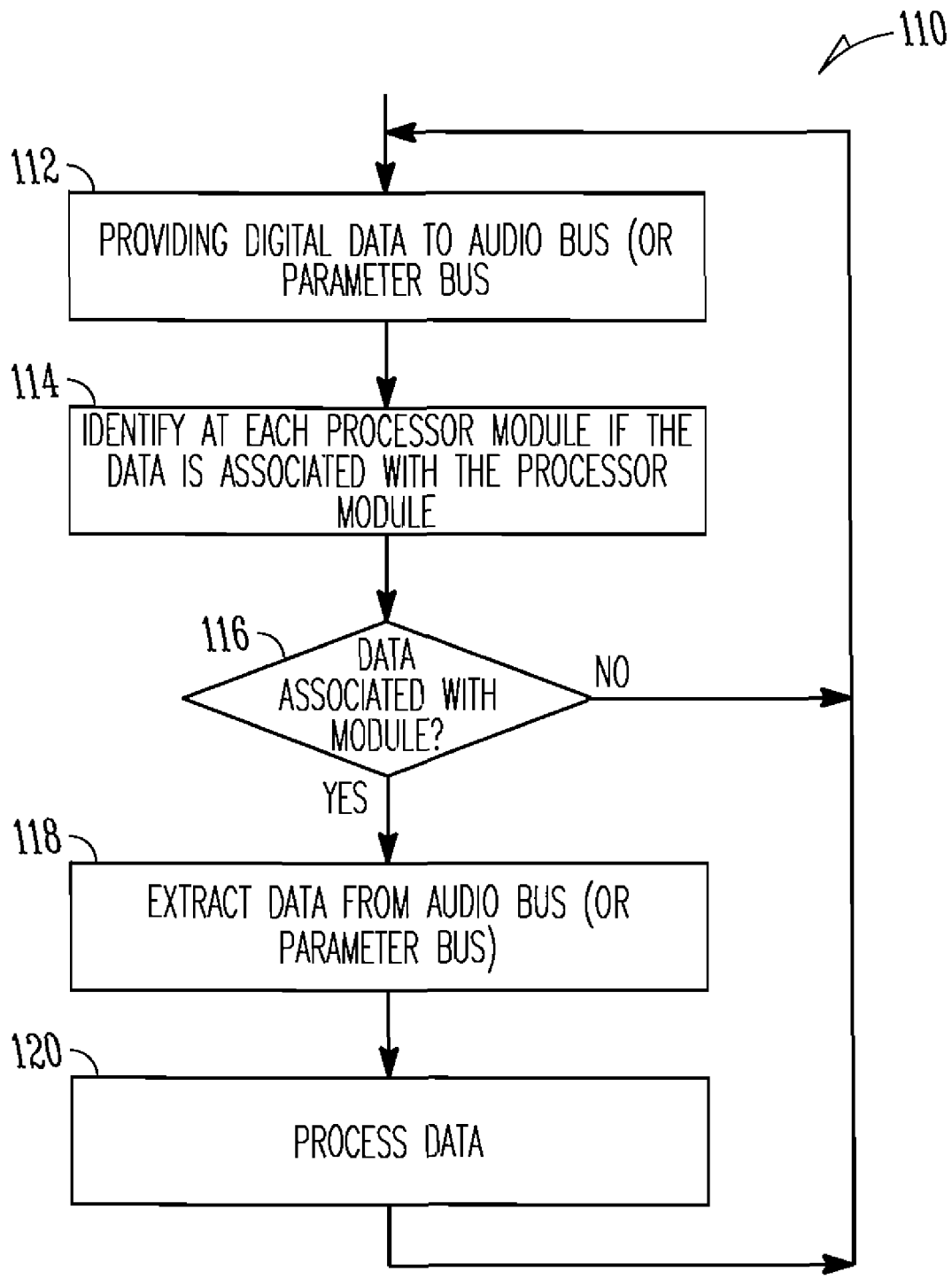
FIG. 8 shows a schematic flow diagram of a method, in accordance with an example embodiment, for communicating data in a digital processing device.

The methodology described above is broadly summarized in FIG. 8 of the drawings. Reference numeral 110 generally indicates a method of communicating digital media data (e.g., digital audio data) in a digital media processing device such as a digital audio processing device. As shown at block 112, digital data is provided on the data path 22. Each particular processor module 12 to 20, 32, 34 then identifies if the data is associated with the particular processor module 12 to 20, 32, 34 (see block 114). The digital data provided on the data path 22 in block 112 may include both digital audio data provided on the audio bus 46 and/or process control data (e.g. parameter data) provided on the parameter bus 48.

As shown at decision block 116, if data on the data path 22 is not associated with the particular processing module 12 to 20, 32, 34, then the data received by the particular module 12 to 20, 32, 34 is merely passed along the data path 22. If, however, the data is associated with the particular module 12 to 20, 32, 34 (e.g. the routing controller 52 has identified that the data is to be routed to the particular processing module 12 to 20, 32, 34), the data (audio data and/or parameter data as the case may be) is extracted from the data path 22 (see block 118). When the extracted data is parameter data, the processing module 12 to 20, 32, 34 uses this data to define the functionality (e.g. algorithm) that it is to execute. When the audio data subsequently arrives, the processing module 12 to 20 processes the audio data to generate processed data (see block 120) that is then provided to the data path 22. Thereafter, the method 110 repeats its monitoring functionality as described herein. It is to be appreciated that any of the methodologies described herein may be provided on any machine-readable medium. Accordingly, the example embodiments extend to a machine-readable medium embodying a sequence of instructions, that when executed by a machine, cause the machine to execute the functionality described herein.

In an example embodiment, the digital processing device 30 is in the form of a VLSI chip. The DSP module 12 may be a 32-bit fixed/floating point DSP that executes four interleaved threads simultaneously. The device 30 may, for example, include one or more of the following:

200 MHz internal clock;
    threaded interleaved architecture DSP with 1200 MFLOPS;
    the DSP may dedicate independent DMA controllers to access host memory/SD RAM;
    the delay module 14 may support fractional delay lengths and 1024 memory accesses;
    the mixer module 20 may be a 4096 channel floating-point audio mixer;
    a 5632 channel self ramping parameter generator may be provided;
    the sample rate converter module 16 may be a 256 channel, hybrid sample rate converter;
    the filter module 18 may be a 512 channel second order digital filter;
    the interface module 38 may be a PCI-X interface for interfacing the device 30 to 100 MHz SD RAM interfaces;
    four stereo $I^2S$ digital inputs may be provided;
    four stereo $I^2S$ digital outputs may be provided;
    four stereo S/PDIF inputs configurable as eight channel C/DIF inputs may be provided;
    four stereo S/PDIF outputs configurable as eight channel C/DIF outputs may be provided;
    PLL slave capability to $I^2S$ and S/PDIF or C/DIF inputs may be provided;
    16 independent configurable general purpose input output pins may be provided on the chip; and
    EPROM interfaces for overwriting reset defaults may be provided.

In an example embodiment, the device 30 may be connected to a general purpose microprocessor either through the interface module 38 or through an embedded microprocessor bus interface. The microprocessor may control the device 30, for example, through the routing controller 52 which, accordingly, may define a host interface. External SD RAM connected to the audio memory transport module 32 may be provided in certain embodiments. In an example embodiment, the audio bus 46 may be sample locked at 48 kHz to each processing module 12 to 20, 32, 34. In an example embodiment, the audio bus 46 provides 256 dedicated 32-bit input channels and, accordingly, the data path interface 70 may include 256 32-bit input channels and 256 32-bit output channels. As mentioned above, the output channels may be predefined or dedicated and the input channels may be programmable. As mentioned above, the device 30 may include a linked list 100 and, in an example embodiment, the DSP module 12 includes 256 input channels that are mapped to the 4096 channels of the audio bus 46 using the linked list 100. In an example embodiment, whenever the DSP module 12 writes to an audio output channel of the audio bus 46 in a given sample period, the audio data written is transferred to the audio bus 46 and an audio ring valid bit may then be set for the particular channel during the next sample period. The parameter bus 48 may provide 256 32-bit input/output channels for parameter passing or routing.

In an example embodiment, any input channel or time-slot of the audio bus 46 (regardless of whether it is data used by other modules on the audio bus 46) may be available for use as a sample-locked 32-bit inter-thread data channel visible to all processing modules 12 to 20, 32, 34. This may provide a primary mechanism to the device 30 for passing data between time domain DSP threads located in different processor modules 12 to 20, 32, 34. When an unused output buffer channel or time-slot is used for inter-thread data passing, the passed data may appear as valid on the audio bus 46 in the time-slot allocated for the particular output buffer channel or time-slot. Data written to an available input or output audio bus buffer for inter-thread data passing may be immediately visible to all other threads for the remainder of the sample period in which it was written.

A SRC 150 (see FIG. 9), in accordance with an example embodiment is described by way of example below. The SRC 150 may correspond to the SRC module 16 described above and, according, may include all (or any portion of) the functionality of the SRC module 16 as described above by way of example.

An example embodiment of the SRC 150 may comprise a plurality of functional blocks including functional blocks to:
- Maintain a primary state of the SRC 150—(src_control)
- Maintain a sample cache—(src_cache)
- Perform the mathematical operation of sample rate conversion—(src_intrp)
- Interface (optionally) to a transport ring (e.g., the transport bus 50 shown in FIG. 2)—(src_tr_if)
- Interface (optionally) to an audio ring (e.g., see audio bus 46 in FIG. 2)—(src_ar_if)
- Interface to host software (e.g., see routing controller 52 in FIG. 3)—(src_host_if)

Figure 9:
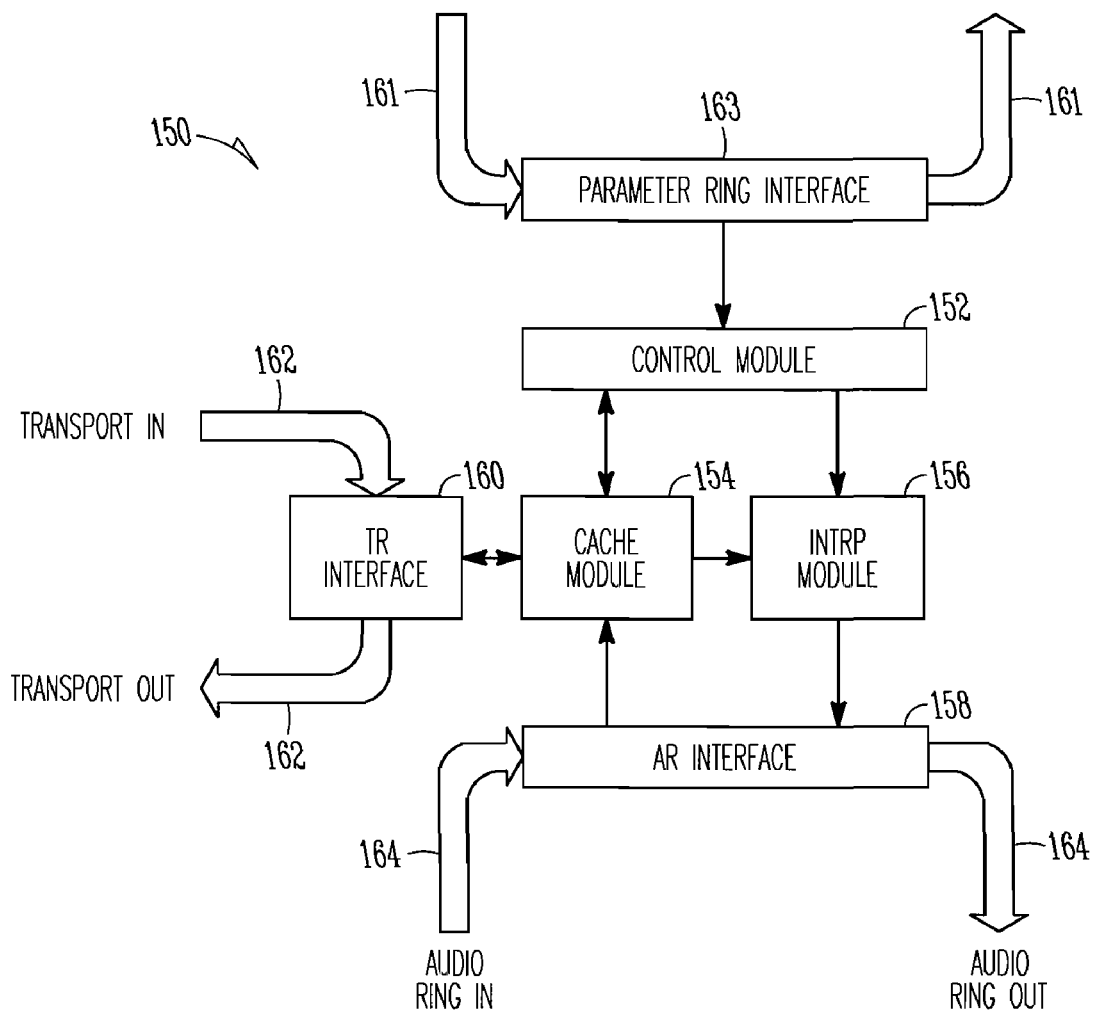
FIG. 9 shows a high level functional processing block diagram of a sample rate converter in accordance with an example embodiment.
Figure 10:
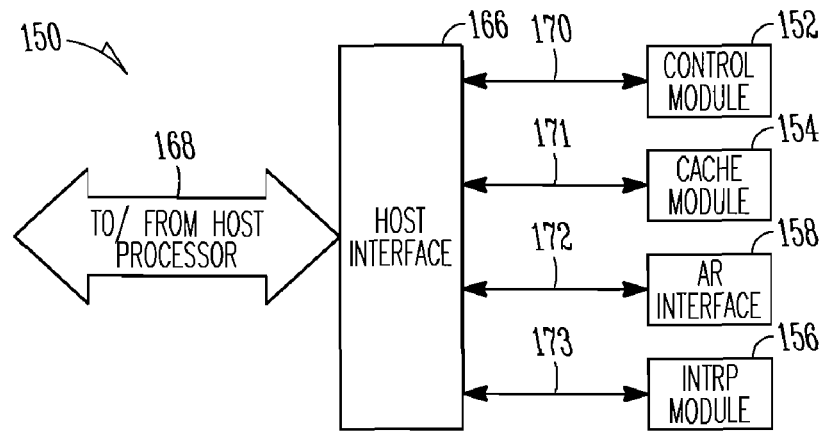
FIG. 10 shows a high level block diagram of a sample rate converter, in accordance with an example embodiment, showing an example host interface connection.

FIG. 9 shows a high level functional processing block diagram of the SRC 150 in accordance with an example embodiment. FIG. 10 shows a high level block diagram of the SRC 150 showing an example host interface connection. The example SRC 150 is shown to include a control module 152, a cache module 154, an interpolation module 156, an audio ring (AR) interface 158, and a transport ring (TR) interface 160. The transport interface 160 interfaces the SRC 150 to a transport ring as shown by arrows 162 and to an audio ring 164 as shown by arrows 162. It will be noted that the audio ring 164 and the transport ring 162 may correspond to the transport bus 50 and the audio bus 46, respectively (see FIG. 1). A parameter bus or ring 161, corresponding to the parameter bus 48, may run parallel with the audio ring 164 and interface with the control module 152 via a parameter ring interface 163. The parameter ring 161 provides parameters (e.g., pitch parameters) to the SRC 150 to process digital data received via the audio ring 164.

In an example embodiment, the control module 152 may maintain a primary state of each channel (e.g., see FIGS. 6 and 7) of the SRC 150. The interpolation module 156 may calculate a new audio sample that is equivalent to that which would be read from a fractional address and, accordingly, the control module 152 may provide the interpolation module 156 with a current fractional address, and provide the cache module 154 with a current integer address as well as an address increment. In addition, the control module 152 may inform the various modules of the SRC 150 as to an On/Off state of each channel, produce interrupts, and provide a time-slot counter to allow data to be removed from, or placed on, the audio ring 164 (e.g., see example time-slot allocations shown in FIG. 6).

The cache module 154 may provide audio samples to the interpolation module 156, generate requests to the transport interface 160 for data transfer to and from main memory (e.g., see the transport module 32 in FIG. 1), and receive data from the audio ring 164 via the audio ring interface 158.

The interpolation module 156 may perform the mathematical operations required for sample rate conversion. Accordingly, the interpolation module 156 may receive an input stream (data samples) at one sample rate, process the input stream, and produce an equivalent output stream of data samples at a different sample rate. It should be noted that the input stream and the output stream are not limited to audio streams but may be any digital data that requires sample rate conversion.

The audio ring interface 158 may receive samples from the audio ring 164 and send selected samples to the cache module 154. For example, in the example data bus 22 shown in FIG. 6, an example data sample for sample rate conversion for a channel 1 is shown in a time slot 155 in the audio bus 46. Accordingly, in this example, the audio ring interface 158 may read this data sample and provide it to the cache module 154. The audio ring interface 158 may also take output data samples from the interpolation module 156 and place them on the audio ring 164.

The transport interface 160 may receive requests from the cache module 154 for data transfer (e.g., to a main memory) and place the data samples on the transport ring 162. In addition, the transport interface 160 may receive responses from the transport ring 162 and communicate them to the cache module 154.

In the example embodiment shown in FIGS. 3 and 4, the routing controller 52 may define the host interface that may use a full synchronous hand-shake approach to interface the various processing modules 12 (e.g., the SRC 150) to 20, 32, 34 of the device 30. It should be noted that, in an example embodiment, the transport interface 160 may have no connection to the host interface 166 (see FIG. 10). In the example SRC 150, the host circuitry may be indirectly provided with a connection to the transport interface 160 via the control module 152, the cache module 154, the audio ring interface 158 and the interpolation module 156 (see FIG. 10). For example, the transport interface 160 may act upon request signals from the cache module 154 (e.g., a cache controller of the cache module 154). The cache controller may use bus-master enable and channel state information from the control module 152 along with cache-specific information to create new request signals. Thus, in an example embodiment, software can be used to control the transport interface 160 through host connections 170 to 173 (see FIG. 10). In an example embodiment, the transport interface 160 may have a connection to a global control register (e.g., of a host chip) which includes a control bit (src_bypass) which may cause the transport interface 160 to act as a pass-through for the transport ring 162. In other words, in an example embodiment, it will appear as though the transport interface 160 does not exist on the transport ring 162 and the transport interface 160 may then generate no new requests nor will it respond to any communication on the transport ring 162. Thus, in an example embodiment, software may have additional control over the transport interface 160 through the global control register.

Figure 11:
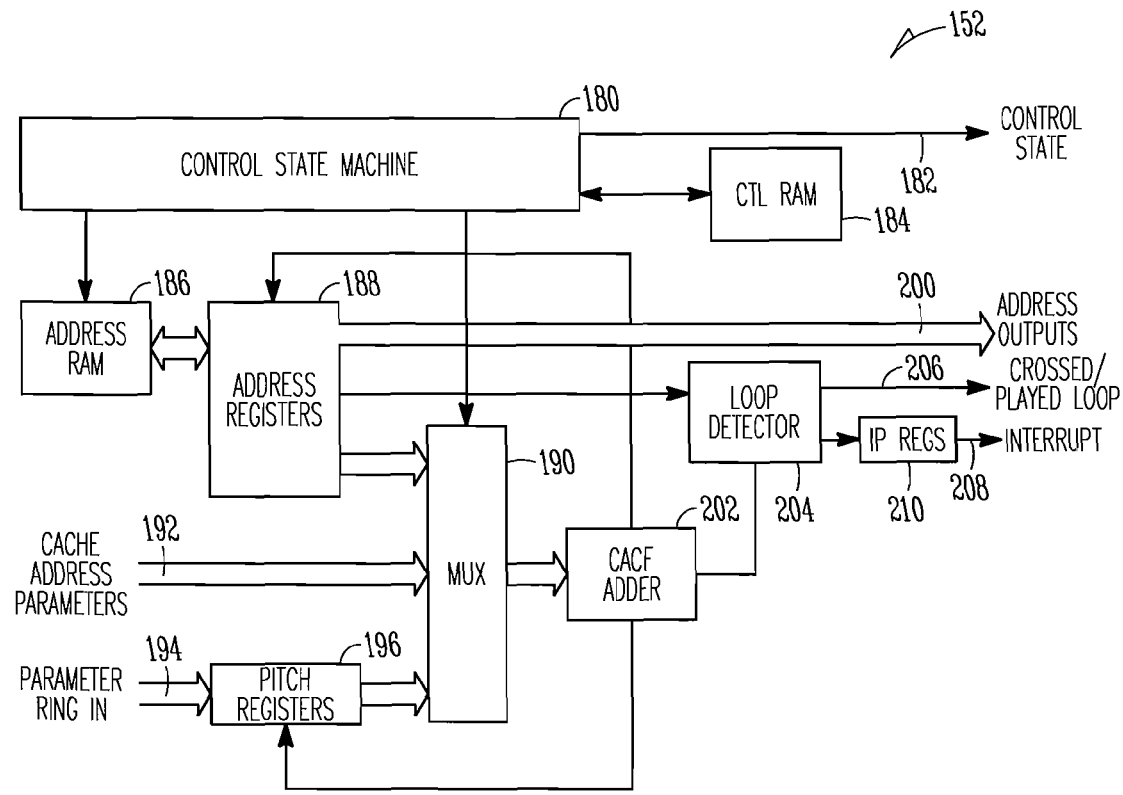
FIG. 11 shows a more detailed example block diagram of a control module of the sample rate converter of FIG. 9.

Referring to FIG. 11, a more detailed example block diagram is shown of the control module 152 of the SRC 150. The control module 152 is shown to include a control state machine 180 which provides a control state to other modules (e.g., the cache module 154 and the interpolation module 156) as shown by line 182. The control state machine 180 is coupled to control RAM (CTL RAM) 184. Further, the control state machine 180 is operable to control address RAM 186, address registers 188, and a multiplexer (MUX) 190. The MUX 190 is shown to receive cache address parameters from the cache module 154 (see cache address bus 192), parameters from a parameter ring (see parameter bus 194) via pitch registers 196, and data from the address registers 188 via a bus 198. The address registers 188 also provide address outputs via bus 200.

In an example embodiment, the control module 152 also includes a CACF adder 202 (Current Address—CA and Current Fractional—CF), as described in more detail below, which receives address data from the MUX 190 and control signals from the control state machine 180 and provides its outputs to the pitch registers 196 and a loop detector 204. The loop detector 204 provides a "Crossed/Played Loop" (see arrow 206) and one or more interrupts (see arrow 208) via interrupt (IP) registers 210.

Figure 12:
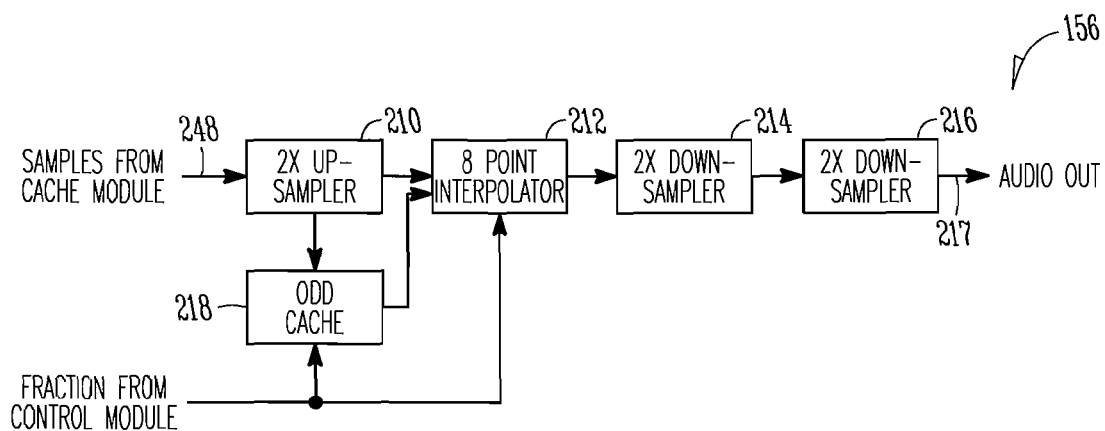
FIG. 12 shows a more detailed example block diagram of an interpolation module of the sample rate converter of FIG. 9.

FIG. 12 shows a more detailed example block diagram of the interpolation module 156 of the SRC 150. The example interpolation module 156 is shown to include an up-sampler 210 (e.g., a 2X up-sampler) which receives audio samples from the cache module 154, up-samples them, and feeds them to an interpolator 212 (e.g., an 8-point interpolator). The interpolator 212, in turn, feeds the samples to a down-sampler 214 (e.g., a 2X down-sampler) followed by another down-sampler 216 (e.g., a 2X down-sampler) which provides an audio output 217 to the audio ring interface 158. An Odd cache 218 receives data from the up-sampler 210 and fraction data from the control module 152 and provides its output to the interpolator 212. The data from the control module 152 is also fed into the interpolator 212. Interpolated samples provide the audio output 217 that is provided to the audio ring interface 158 to be inserted into the audio ring 164.

Figure 13:
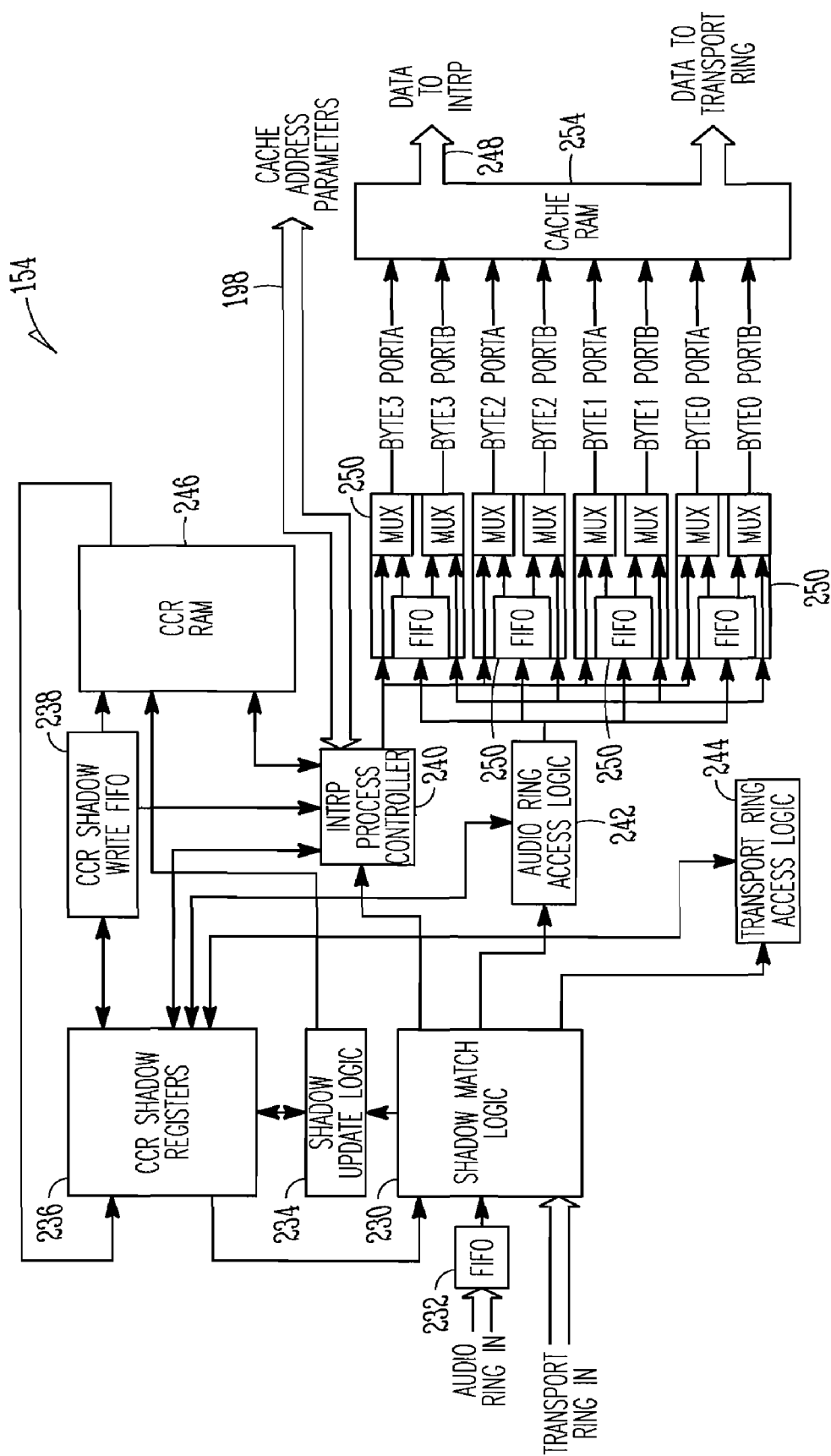
FIG. 13 shows a more detailed example block diagram of a cache module of the sample rate converter of FIG. 9.

FIG. 13 shows a more detailed example block diagram of the cache module 154 of the SRC 150. The cache module 154 is shown to include shadow match logic 230 which receives audio data from the audio ring 164 via a FIFO buffer 232 and audio data from the transport ring 162. The shadow match logic 230 may determine if a current copy of the Cache Control Register (CCR) is held in the shadow registers 236 for the incoming transaction, optionally fetches a current copy using the shadow update logic 234, and produces selectors for use by the interpolation process controller 240, audio ring access logic 242, and transport ring access logic 244. Thus, the shadow match logic 230 may serve to direct transactions to use the matching shadow register. The shadow update logic 234 may read a CCR register from either the CCR RAM 246 or the CCR Shadow Write FIFO 238 and insert it into the CCR shadow registers 236, causing the least recently used (LRU) shadow to be inserted into the CCR Shadow Write FIFO 238 for subsequent write back to the CCR RAM 246. The cache RAM 254 may provide audio data samples to the interpolation module 156 via bus 248 under the direction of the interpolation process controller 240 which, in turn, receives and provides cache address parameters (see cache address parameters bus 198 in FIGS. 11 and 13). In an example embodiment, four FIFO/MUXs 250 are provided which control access to the cache RAM 254 that provides data to the interpolation module 156 (see FIGS. 9 and 11). The FIFO/MUXs 250 may prioritize access between the audio ring access logic 242 and one of either the interpolation process controller 240 or the transport ring access logic 244. In an example embodiment, two inputs of the FIFO/MUXs 250 pass through immediately to the cache RAM 254. The other input passes through a FIFO that must wait for a clock cycle during which there is no activity on at least one pass-through input. The audio ring access logic 242 connects to the FIFO input of the FIFO/MUXs 250. The interpolation process controller 240 may connect to the first pass-through input. The transport ring access logic 244 may connect to the second pass-through input. The cache RAM 254 may be dual-ported and byte accessible. Since in an example embodiment the cache RAM is 32-bits wide, there may be effectively eight ports on the cache RAM 254. The FIFO/MUXs 250 arbitrate access to each of the eight ports, granting the interpolation process controller 240 access to port A of each byte, and granting the transport ring access logic 244 access to port B of each byte. The audio ring access logic 242 may provide access requests to the FIFO inputs, and the FIFO/MUXs 250 service the access requests via both port A and port B of each byte, as available. When more than one request from the audio ring access logic 242 is present in the FIFO and both port A and port B are available, then the FIFO can service two requests simultaneously, one on each port.

In an example embodiment, conceptually, the SRC 150 may run two concurrent operations which may include minimal inter-dependent scheduling. For example, a first scheduling operation may include scheduling of mathematical operations involved in performing sample rate conversion. A second scheduling operation may include scheduling data transfer to and from the other devices/modules (e.g., the modules 12, 14, 18, 20 in FIG. 1) or circuitry off-chip.

In an example embodiment, the sample rate conversion operation may have a fixed schedule in which it reads input state variables and samples, and produces output state variables and samples. In an example embodiment, the operation may be a highly pipelined operation, requiring 96 clocks from start to finish. However, processing a different channel may begin every 16 clocks, and produce a new output sample every 16 clocks. Since, in this example embodiment, it takes 96 clocks to complete processing a single channel, the sample rate conversion may in an example embodiment simultaneously operate on 6 different channels, albeit in different parts of the algorithm.

A data transfer operation (e.g., a transfer of data samples between the SRC 150 and the audio ring 164 and the transport ring 162) may work primarily with an on-demand schedule. In an example embodiment, there may be two exceptions to this: audio transport request generation, and audio ring output. Both of these exceptions may be scheduled along with a sample rate conversion operation. However, in an example embodiment, the majority of work performed in data transfer may not be scheduled with reference to any sample rate conversion operation. The transport interface 160 may be configured to transfer burst data to and from main memory (e.g., provided by a host computer system accessed via the interface module 38 shown in FIG. 1) at any time, depending on the system load. Likewise, single data transfers from SRC 150 to the audio ring 164 can occur at any time, for example, depending on software programming of flexible routing through the audio ring input mapper logic (see FIG. 7).

In an example embodiment, the SRC 150 may not divide these two conceptual operations cleanly along sub-module boundaries. Many variables and resources may be shared between the two operations. For example, the control module 152, the cache module 154, and the interpolation module 156 may perform the sample rate conversion operation. In an example embodiment, the control module 152, the cache module 154, the transport ring interface 160, and audio ring interface 158 may perform the data transfer operation.

The sample rate conversion operation may perform the mathematical tasks involved in taking an input data stream (e.g., audio data stream) at an input sample rate and producing an equivalent output data stream at a selected output sample rate. It may also perform necessary ancillary tasks such as memory address maintenance, state transitions for channel startup and shutdown, and interrupt generation.

In an example embodiment, the sample rate conversion operation may run at a reference sample rate (RSR), producing one output sample at a time. The RSR may be a fixed, power-of-two multiple of a chip master sample rate. In an example embodiment, the RSR choices may thus be limited to 1, 2, 4, and 8 times the chip master sample rate. Thus, if a chip hosting the SRC 150 runs at 48 kHz, the available RSR choices may be 48 kHz, 96 kHz, 192 kHz, and 384 kHz. The RSR can apply to either the output or the input sample rate. In most modes of operation, the RSR may apply to the output sample rate, allowing the input sample rate to vary. In certain circumstances, for example down sampling to record audio at a user-specified sample rate that is not equal to one of the available reference sample rates, the RSR may apply to the input sample rate. In these example cases, it is the output sample rate that may vary.

In an example embodiment, the control module 152 may operate in a variable output mode. In this mode, the input rate is fixed at a Reference Sample Rate, and the output rate is variable according to the pitch. The SRC 150 may maintain the relationship Pitch=input_rate/output_rate, but in the variable output mode, the input rate is equal to the RSR:

Output_rate=RSR/Pitch

To implement the variable output mode, the control module 152 may detect when an output sample should not be generated and may temporarily change the state of the channel to OFF. Since the rest of the SRC 150 identifies the channel as being in the OFF state, no output may be generated. A small counter operating at the sample rate may suffice to compare against the LSBs of CA to determine when to output a sample. When the counter is equal to the LSBs of CA, the SRC may output a sample and increment CA by the pitch. When the counter is not equal, the SRC may not output a sample and may not increment CA. For example, if the pitch is 2.0 and the LSBs of CA are 0, the SRC may output a sample when the counter is equal to 0. It will then increment CA by 2 (pitch), so CA will then be equal to 2. The next sample period, the counter is equal to 1 and does not equal CA, so the SRC may not output a sample. The sample period after that, the counter is equal to 2 and may thus equal CA, so the SRC will output a sample and update CA by the pitch. In this way, the output rate is equal to input_rate/2.0.

In an example embodiment, a variable parameter (e.g., "pitch") may indicate a ratio of an input sample rate to an output sample rate. To produce this effect, the variable pitch parameter may determine an amount a fractional sample-address increments each sample period. The output sample produced during each sample period may depend on the fractional address at that time. In an example embodiment, the pitch parameter may not be stored locally within the SRC 150. A parameter generator external to the SRC 150 may, for example, produce the pitch parameter. The SRC 150 may receive the pitch parameter via a parameter ring or bus (see for example parameter bus 48 in FIGS. 2 and 6). In an example embodiment, the parameter ring may be parallel to the audio ring 164 and, accordingly, the audio ring interface module 158 of the SRC 150 may register the parameter ring data (see pitch registers 196 in FIG. 12) and provide the registered parameters to the control module 152. The SRC 150 may be configured to support a maximum pitch of 8.0, with 24 bits of fractional resolution.

In an example embodiment, the control module 152 may maintain a fractional sample-address and receive a registered parameter ring value (see pitch register 196) from the audio ring interface module 158. Based on an audio ring channel ID (e.g., see FIG. 7), the control module 152 may register the pitch parameter from the parameter ring every 16 clocks. The control module 152 may store the fractional address in two fields in the address registers 188, an integer portion and a fractional portion. The integer portion may be the Current Address (CA). The fractional portion may be the Current Fraction (CF). In an example embodiment, the complete fractional address is the concatenation of the two fields, referred to as CA.CF, with a binary point between them. The control module 152 may maintain the CA field in units of bytes, but may maintain the CF field in units of samples.

Each sample period, the control module 152 may add the pitch parameter to CA.CF to calculate a new CA.CF. However, the pitch parameter as received from the parameter ring (e.g., called pitch_raw), may be entirely in units of samples. In order to maintain CA in bytes, the control module 152 may first convert the integer portion of the pitch parameter to units of bytes-per-sample, keeping the fractional portion in samples. The conversion to bytes may account for both sample format and an interleave factor, where the interleave factor is equal to the number of discrete channels interleaved in a particular memory buffer. For example, a stereo recording may be represented in one memory buffer by providing the left channel samples in even numbered addresses and the right channel samples in odd numbered addresses. In an example embodiment, the control module 152 performs the pitch conversion in separate steps, first for the sample format and then for the interleave factor. The sample format conversion may use an adder to multiply by 1, 2, 3, or 4 bytes. The interleave factor conversion may use a small multiplier to multiply by any integer from 1 to 16. In an example embodiment where the largest sample format is 4 bytes and the highest interleave factor is 16, the integer portion may by multiplied by as much as 64.

The CA may not increment forever as that would require an infinite address space. In order to play continuously, in an example embodiment the SRC 150 implements looping using two addresses, namely, a Loop Address (LA) and a Start Address (SA). When a new CA is greater than or equal to the LA, the SRC 150 may adjust the CA such that it is between the SA and the LA. After calculating the new CA.CF, the control module 152 may compare the new CA field with the LA to determine if loop processing must occur. In an example embodiment, it performs the comparison by subtracting the LA from the CA and checking the sign bit of the result. If the sign bit is 0, this indicates the CA is greater than or equal to the LA, and it follows that loop processing must occur. The mathematical transformation of CA at the loop may be as follows:

CA=CA−LA+SA

This is algebraically equivalent to subtracting the loop length (LA−SA) from the CA. The control module 152 may have already performed a portion of the transformation (CA−LA) in order to compare the CA with the LA. The loop detector 204 of the control module 152 may perform the loop transformation as follows:

CA_minus_LA=CA−LA if (CA_minus_LA>=0) then CA=CA_minus_LA+SA

This example implementation allows the use of a single adder/subtracter.

The CA_minus_LA variable in the above method may not exist as such in the SRC 150. Due to cache management issues and implementing auto-loading loop addresses, an example embodiment may use the output register of an adder/subtracter sub-module 202 (e.g., src_cacf_adder) to perform the comparison operation, and then store the (CA−LA) result in a CA register. At this point, the CA register may generally be a very small number, equal to its distance beyond the LA, equivalently its distance beyond the SA, and further equivalently the residual cache invalid size (CISZ). After the cache module 154 completes its loop processing, the cache module 154 may add the value of CA to the CISZ, and the control module 152 may add the SA to the CA. The control module 152 may detect that the cache module 154 has completed its loop processing when a req_state_s0_i signal equals LOOP_DONE. In an example embodiment, the earliest this can occur is one sample period after the CA crosses the LA. Thus, during loop processing, the CA may be equal to (CA−LA) for a minimum of one sample period.

Whenever the control module 152 detects that CA>=LA, it may set a signal (e.g., crossed_loop_flag) to indicate to the appropriate modules (e.g., the modules 154 and 156) of the SRC 150 that loop processing should begin.

In an example embodiment, central to the control module 152 is the sub-module CACF adder 202. The CACF adder 202 may be an adder/subtracter which includes a carry circuit from the fractional portion to the integer portion. As mentioned above, this may be necessary to maintain the integer portion in bytes. The carry from the fraction to the integer may account for both the sample format and the interleave factor, just as the control module 152 may do when adjusting pitch for bytes.

The CACF adder 202 may calculate a signal (e.g., frac_carry_in_bytes), which is equal to the sample size in bytes times the interleave factor, AND'ed with the actual carry out of the fractional adder. The frac_carry_in_bytes signal may then be added to the result of the integer adder.

In an example embodiment, because of the sample cache (e.g., a single channel's portion of the cache RAM 254), the playback address may not equal to the CA. Instead, the playback address may be equal to the CA minus the size of the cache RAM 254. The size of the cache may refer to the per-channel size, given by the following:

min(1024, 128*(RSR/48 kHz)*IL_FACTOR).

For example, with RSR=96 kHz and IL_FACTOR=2 (stereo 96 kHz), the size of the cache may be 512 bytes. The size of the per-channel cache may never exceed 1024, thus the use of the min( ) function. Accordingly, the samples given to the interpolation module 156 for sample rate conversion may be from the address equal to CA minus the size of the cache RAM 254. In the case of 24-bit samples, the playback address may be rounded up to the nearest sample boundary since the cache size is generally not a multiple of 3 bytes.

The control module 152 may calculates the size of the cache RAM 254 and place the value in a signal called max_cisz. The value of max_cisz may be equal to 128 times the interleave factor times RSR/48000, but in an example embodiment it may not exceed 1024.

Interrupts may be used by software to indicate when a buffer can be discarded or re-used for new samples. The control module 152, in an example embodiment, generates an interrupt when a channel has played the sample at the loop point (e.g., see loop detector 204), which is the sample immediately preceding the LA. In an example embodiment, there may be 256 potential interrupt sources, one per channel. The control module 152 may store the interrupts in an array of eight 32-bit registers, called ip_reg (see IP registers 210 in FIG. 12). The interrupt output 208 (e.g., interrupt_o) may be equal to the bit-wise OR of all 256 bits. The interrupt output 208 may be a registered output to reduce timing issues. A sub-module (src_ip_reg) (see IP registers 210 in FIG. 11) may be provided to maintain a single 32-bit register of the IP registers 210. The control module 152 may use a loop to instantiate eight src_ip_reg sub-modules.

As described above, the address of the samples being processed by the interpolator 212 (referred to as the playback address) may not be equal to the CA, but equal to the CA minus the size of the cache RAM 254, max_cisz. In addition, software may require an interrupt notification once the sample at a loop point is discarded and therefore no longer needed. This may be accomplished by introducing an extra offset (sinc_offset) due to the group delay of interpolation filters (see block 212 in FIG. 12). The control module 152 may withhold the interrupt until the playback address has crossed the loop plus max_cisz plus sinc_offset.

In an example embodiment, by the time the playback address crosses the loop, the control module 152 has already adjusted the CA so that it is between the SA and the LA. Therefore, it may compare the CA with the SA plus the size of the cache plus sinc_offset to determine when to generate the interrupt. The sinc_offset may be sample format dependent and, in an example embodiment, is equal to eight times the size of a sample. This example implementation may create a signal called played_loop_threshold, which is equal to max_cisz+sinc_offset. The control module 152 may subtract the SA from CA, and then perform the comparison by subtracting played_loop_threshold from the result. If the result of the comparison is greater than or equal to 0, the loop detector 204 in control module 152 may set a signal called played_loop_flag to indicate that the sample at the loop point has been discarded.

However, it is possible to detect played_loop_flag before the CA has reached LA for the first time. For example, software may initialize the CA to equal the SA at channel startup time. With the exception of very small loops, in an example embodiment the control module 152 may detect played_loop_flag before the CA has reached the LA. In order to avoid a false loop interrupt, there may be an additional interrupt pending flag for each channel. The IP registers 210 (see FIG. 11) may maintain ipp_reg to indicate interrupt-pending-pending when the control module 152 indicates the crossed_loop_flag is true. Then, when the control module 152 indicates played_loop_flag is true, the src_ip_reg module may set the channel's bit in ip_reg if the corresponding bit in ipp_reg is set. Otherwise, it ignores played_loop_flag.

Figure 14:
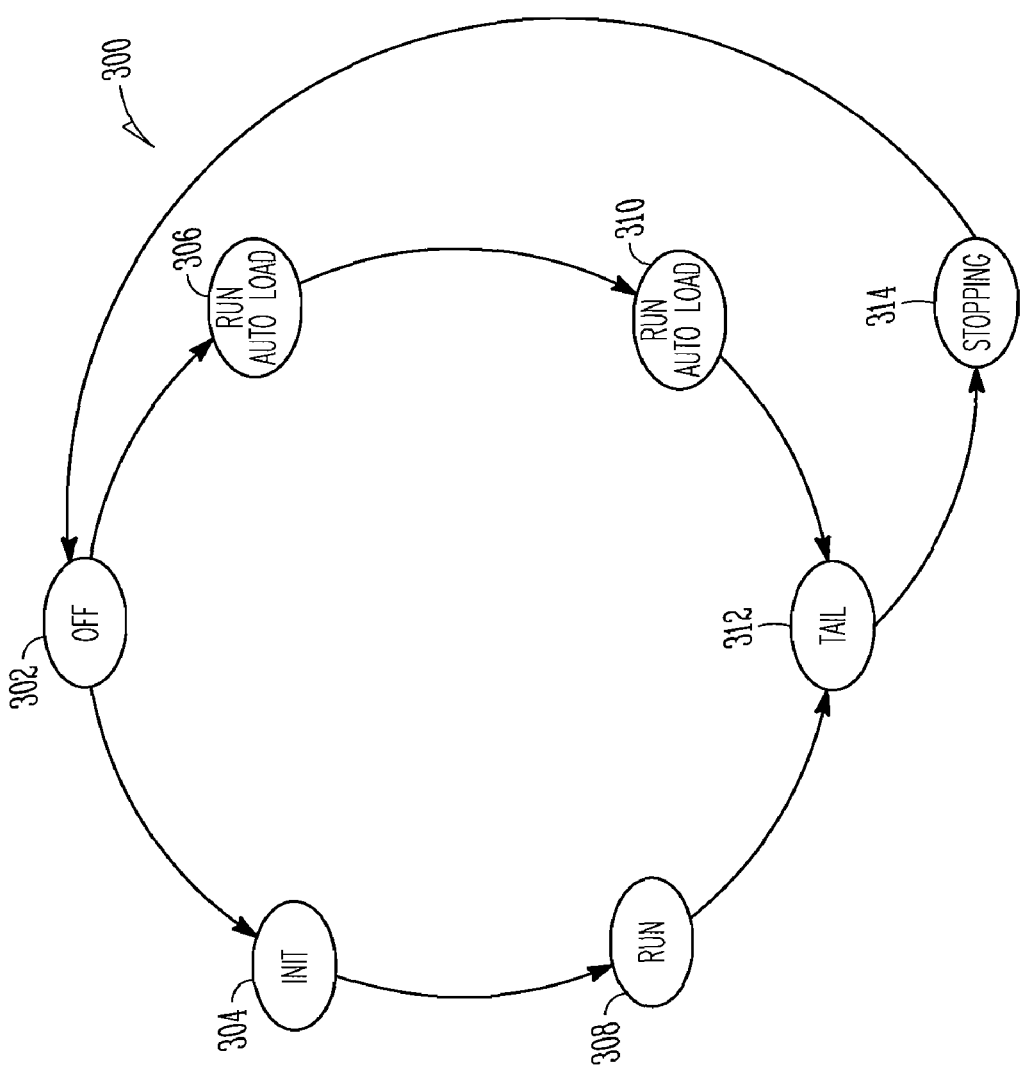
FIG. 14 shows example states a control state machine of the control module of FIG. 12.

FIG. 14 shows seven example states 300 of a state machine of the control module 152. In an example embodiment the states 300 may be provided in the control state machine 180 (see FIG. 11). The seven states may, for example, be encoded as a 3-bit vector. As shown in FIG. 14, the seven example states may be:

- OFF 302—The SRC 150 performs no operations.
- INIT 304—The SRC 150 is initializing, preparing to transition to a RUN state.
- INIT_AUTO_LOAD 306—The SRC 150 is initializing, preparing to transition to RUN_AUTO_LOAD 310.
- RUN 308—The SRC 150 is running.
- RUN_AUTO_LOAD 310—The SRC 150 is running in auto-load mode.
- TAIL 312—The channel SRC 150 is preparing to stop on loop, playing the last samples.
- STOPPING 314—The channel SRC 150 is preparing to stop on loop, letting the interpolation filters settle.

When the current state is the RUN state 308 or the RUN_AUTO_LOAD state 310 and a Stop-On-Loop (SOL) bit is not set, the control state machine 180 may do nothing but maintain its current state. When is in this condition, software may be required to intervene to change the state of the SRC 150. This may also be true for the OFF state 302. In the INIT state 304, the interpolation filters (see interpolator 212 in FIG. 12) may initialize their state variables, and the cache module 154 may pre-load the initial samples into the cache RAM 254 of the cache module 154. The initial samples may be pre-loaded from SDRAM or main memory. The control module 152 may transition to the RUN state 308 when the cache RAM 254 is at least half full. The INIT_AUTO_LOAD state 306 may be identical with respect to the interpolation filters and cache RAM 254, but the control module 152 may transition to the RUN_AUTO_LOAD state 310 when the cache RAM 254 is at least half full. If the SOL bit (see below) is set, the control module 152 may transition to the TAIL state 312 when the crossed_loop_flag is set. In the TAIL state 312, the control module 152 will transition to the STOPPING state 314 when the played_loop_flag is set. In the STOPPING state 314, the control module 152 will transition to the OFF state 302 when a next-auto-load field (NAL) field is equal to 31, indicating that 32 sample periods have elapsed since the transition to the STOPPING state 314.

The SRC 150 can stop a channel when it has played the sample at the loop point. This may be useful for one-shot sounds and for graceful shutdown of playback. The control module 152 may use a per-channel state machine (e.g., the control state machine 180) to implement the SOL operation. The SOL operation may require two states: the TAIL state 312 and the STOPPING state 314. The TAIL state 312 may indicate a SRC channel is playing the back the end of the loop. The STOPPING state 314 may indicate that the SRC channel is allowing the interpolation filters settle to a quiescent state. If the SOL bit is set in the corresponding CTL register (see CTL RAM 184), the control module 152 may change the channel state to the TAIL state 312 when the crossed_loop_flag is true. Then, the control module 152 may change the state from the TAIL state 312 to the STOPPING state 314 when the played_loop_flag is true. During the STOPPING state 314, the control module 152 may count 32 sample periods and then change the state to the OFF state 302. In an example embodiment, to save memory storage, the cache module 154 may use the NAL field of the CCR registers (e.g., see the CCR shadow registers 236 shown in FIG. 13) as a sample counter during the STOPPING state 314. The control module 152 may reads a nal_s0_i signal from the cache module 154 to determine when to transition from the STOPPING state 314 to the OFF state 302.

The interpolation module 156 (src_intrp) may achieve a relatively high quality conversion using a hybrid filtering approach. In an example embodiment, the input samples first go through a fixed, factor-of-2 up-sampling stage (see up-sampler 210 in FIG. 12). Following the up-sampling stage, the samples go through an 8-point FIR interpolator (see the interpolator 212) with a variable fraction. Finally, the interpolated samples go through a fixed, factor-of-4 down-sampling stage (see down-samplers 214, 216) to provide the final audio output 217.

The interpolation module 156 may instantiate the up-sampler 210 (src_up_k), the interpolator 212 (src_gs4x), and the down-samplers 214, 216 (src_down). In an example embodiment, the up-sampler 210 implements a factor-of-2 up-sampling stage, the interpolator 212 implements a 8-point FIR interpolator stage, and the down-samplers 214,216 implement the factor-of-4 down-sampling stage.

The following illustrates an example hierarchy of the up-sampler 210, the interpolator 212, and the down-samplers 214, 216:

```
src_intrp
    src_up_k
        src_ap_k (e.g, 8 instances)
        hram_bt (e.g, 5 instances)
    src_gs4x
        src_gsrom
            src_gsrom_even
            src_gsrom_odd
        src_coeff_intrp (e.g., 2 instances)
        src_gs4x_alu_1clk
    src_down
        src_ap
        hram_bt (e.g., 2 instances)
```

In an example embodiment, the factor-of-4 down-sampling output stage (see down-samplers 214, 216) may require 4 input samples for every output sample. In order to provide the input samples for the down-sampler, the 8-point FIR interpolator (see interpolator 212) may operate 4 times for each final output sample. Likewise, the FIR interpolator requires 8 input samples for every one of its output samples. In order to provide the 8 input samples for the FIR interpolator, the factor-of-2 up-sampler (see up-sampler 210) operates 4 times for each time the FIR interpolator operates.

As stated above, in an example embodiment the SRC 150 may begin processing a new channel every 16 clocks. Accordingly, each processing stage of the interpolation module 156 may have a total of 16 clocks cycles to spend processing on a single channel. This may dictate the number of arithmetic elements required for each stage of the interpolation operation.

In an example embodiment, a factor-of-2 up-sampler (see up-sampler 210) may provide two input samples to the interpolator 212 (e.g., a FIR interpolator) on every clock. The up-sampler 210 may be an $8^{th}$-order all-pass Quadrature Mirror Filter (QMF) structure, which in an example embodiment may make it the most computationally intensive stage of the entire data path of the SRC 150. For example, up-sampler 210 may use eight individual all-pass filtering modules, each performing 1 multiply and 3 adds. Accordingly, the up-sampler 210 may comprise 8 multipliers and 24 adders.

In an example embodiment when the interpolator 212 is an 8-point FIR interpolator, it may complete each 8-point filtering operation within 4 clocks. To accomplish this, it may use a multiply-accumulate module consisting of two multipliers and a three-input adder.

The factor-of-4 down-sampling stage (see down-samplers 214, 216) may use a single all-pass filter module with 1 multiplier and 3 adders. The down-sampler structure may comprise two factor-of-2 down-samplers in series. The first may be a $4^{th}$-order all-pass QMF structure, and the second may be an $8^{th}$-order all-pass QMF structure. The down-samplers 214, 216 may time-division-multiplex the single all-pass module (see FIGS. 19 and 20) to implement all sections of both the $4^{th}$-order and $8^{th}$-order down-samplers. In an example embodiment, the factor-of-4 down-sampler may be the least computationally intensive stage of the data path of the SRC 150.

In an example embodiment, the up-sampler 210 may implement a factor-of-2 up-sampler based on two chains of all-pass filters organized as an $8^{th}$ order QMF, also known as power-symmetric elliptic filters. Since this filter may be simply used as an up-sampler, the upper-band input to the generalized QMF band-recombiner may equal to zero. Thus, no add or subtract may be necessary at the inputs to the two chains of all-pass filters.

Figure 15:
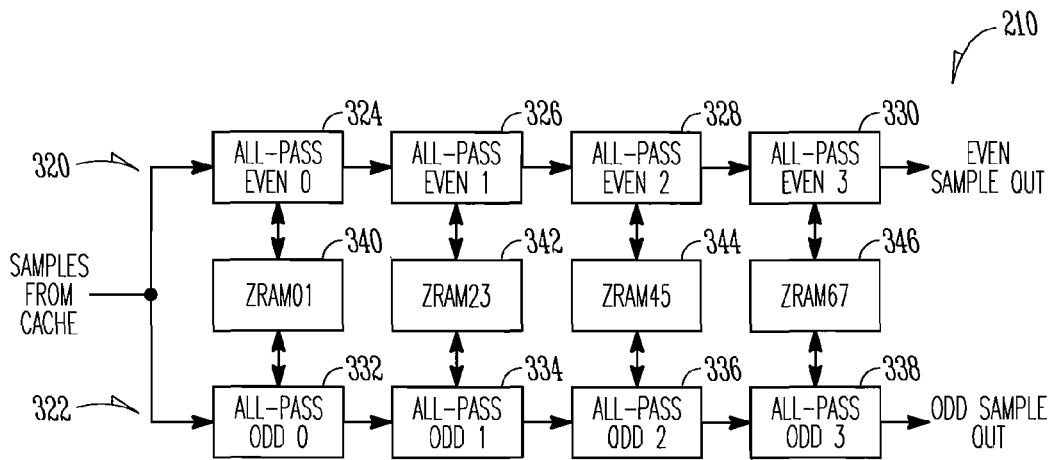
FIG. 15 shows an example structure of the up-sampler of the interpolation module shown in FIG. 12.

FIG. 15 shows an example structure of the up-sampler 210 shown in FIG. 12. The up-sampler 210 is shown to include an even path 320 to provide even samples, and an odd path 322 to provide odd numbered samples to the interpolator 212. The even path may 320 include all-pass even filters 324-330 and the odd path 324 is shown to include all-pass odd filters 332-338. In an example embodiment, the all-pass filters use a 3-add, 1-multiply, with pipeline registers inserted at each mathematical operation to produce a 3-clock delay from input to output. The number of pipeline registers in each path may ensure proper time-alignment of operands. For example, the two-register path from the input to the subtracter may time-align the input operand with a multiplier output, which has one register following the input adder and one more following the multiplier (see FIG. 16 which is described in more detail below). Likewise, a two-register path from the delay memory ($Z^{-1}$) 360 to the output adder may time-align the Z-data with the multiplier output.

Figure 16:
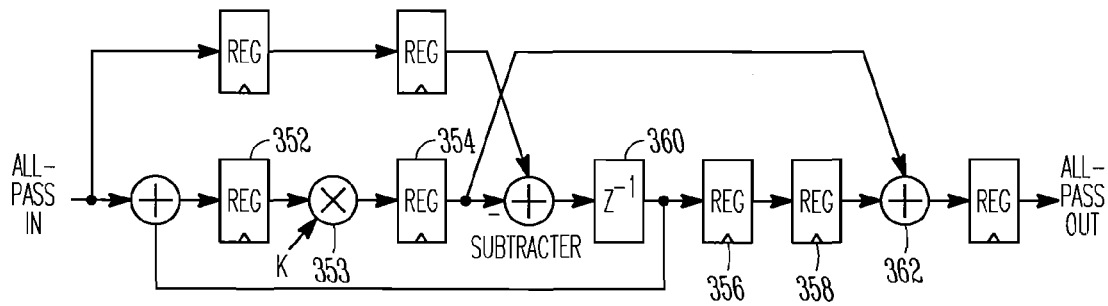
FIG. 16 shows an example QMF structure of example all-pass filters of the interpolation module shown in FIG. 12.

FIG. 16 shows an example QMF structure 350 of the example all-pass filters 324-338. In an example embodiment, the up-sampler 210 may produce two output samples on each clock. To achieve this, there may be 8 independent instances of all-pass filter arithmetic units. In the QMF structure 350, coefficients (K) (see multiplier 353) may not change and certain partial-products may not be needed. Further, in an example embodiment, the coefficients (K) that may be utilized may include long strings of binary 1's or 0's, and the coefficients may be quantized to the smallest number of bits that still achieved the desired quality level. These coefficients may encode into very efficient structures in a modified Booth encoding scheme. The up-sampler 210 may use a construct to instantiate the appropriate custom multiplier for each of the 8 different constants K (one for each independent all-pass filter arithmetic filter unit). A generic parameter coef may control which specific multiplier to instantiate (see FIG. 16).

In an example embodiment, when the pitch is low enough, the up-sampler 210 should deliver the same 8-sample frame to the 8-point FIR interpolator 212 multiple times. For example, if the pitch is 0.5, the 4 iterations of FIR interpolator 212 may see fractional addresses of 0.0, 0.125, 0.25, and 0.375. In all cases, the interpolator 212 requires the same 8-sample input frame—only the fraction may change in order to modify the output. However, in an example embodiment, the up-sampler 210 may use IIR filters, which do not generate the same outputs on successive processing periods. Accordingly, a state variable, $Z^{-1}$, may not be stored in each all-pass section when the interpolator 212 requires duplicate inputs on the next iteration. Given unchanged state variables and the same input samples, the IIR filters will generate a duplicate frame. This is not straightforward, since the state variables must advance through 4 input samples in order to generate the 8 output samples to deliver to the interpolator 212. It may be important since it allows the cache to store an image of the input sample stream, avoiding extra memory storage and extra computation that would be necessary to up-sample the input stream prior to storage in the cache. Since transport activity can occur simultaneous with audio ring activity, it would require instantiating two up-samplers, one for audio ring input and one for transport ring input. Further, it would double the memory size of the cache. Since it increases silicon area in both memory size and logic gate count, it may be an undesirable option to up-sample prior to storage in the cache. It is may be more optimal to up-sample when reading out of the cache. However, it requires the ability to process 4 input samples, then "rewind" the IIR filters to one of the states prior to processing the first, second, or third of the four samples.

The up-sampler 210 may use a set of Cache Read Address (CRA) difference signals to detect when to store the state variables. The CRA difference signals (e.g., cra_diff0, cra_diff1, cra_diff2, and cra_diff3) may indicate the difference in the start position of IIR filter inputs for each of the 4 iterations. It should be noted that, unlike the CRA signal itself, these difference signals may be in units of samples, not bytes. The control module 152 may generate the CRA difference signals and provide them to the up-sampler 210.

Each of the 4 iterations may generate 8 output samples from 4 input samples. In an example embodiment, the maximum pitch may be 8.0, so the maximum value for any of the CRA difference signals may be 2. Accordingly, if the pitch is 8.0, each of the 4 iterations may skip ahead by 2 input samples so that at the end of the $4^{th}$ iteration the CRA has skipped ahead by 8 input samples. Therefore in an example embodiment, within a single iteration, the state variables may need to be stored after processing either the $1^{st}$ or $2^{nd}$ input samples, or they may not need to be stored at all. Thus, there may be only three cases: cra_diffX=0, 1, or 2. In an example embodiment a value of 0 may indicate do not store the state variables, a value of 1 may indicate store the state variables after the $1^{st}$ input sample, and a value of 2 may indicates store the state variables after $2^{nd}$ input sample.

The signals and ports corresponding to the state variables may be named using the DSP concept of z, where $z^{-1}$ indicates a delay of one unit of discrete time, or one sample period.

In an example embodiment, a reservation table for inputs and outputs of the all-pass section provides for looping back the z output value to the z input value through a single clock delay. For the first input sample of the first of the 4 iterations, the z input value may come from ZRAM01 340, ZRAM23 342, ZRAM45 344, or ZRAM67 346. In addition, on the first input sample of subsequent iterations when cra_diff is equal to 2 for the previous iteration, the registered z output of the all pass unit may loop back rather than coming from one of the ZRAMs 340, 342, 344, or 346. That is because in an example embodiment the reservation table may start the subsequent iterations at the same time the z output is being written back after processing the $2^{nd}$ input sample.

Figure 21:
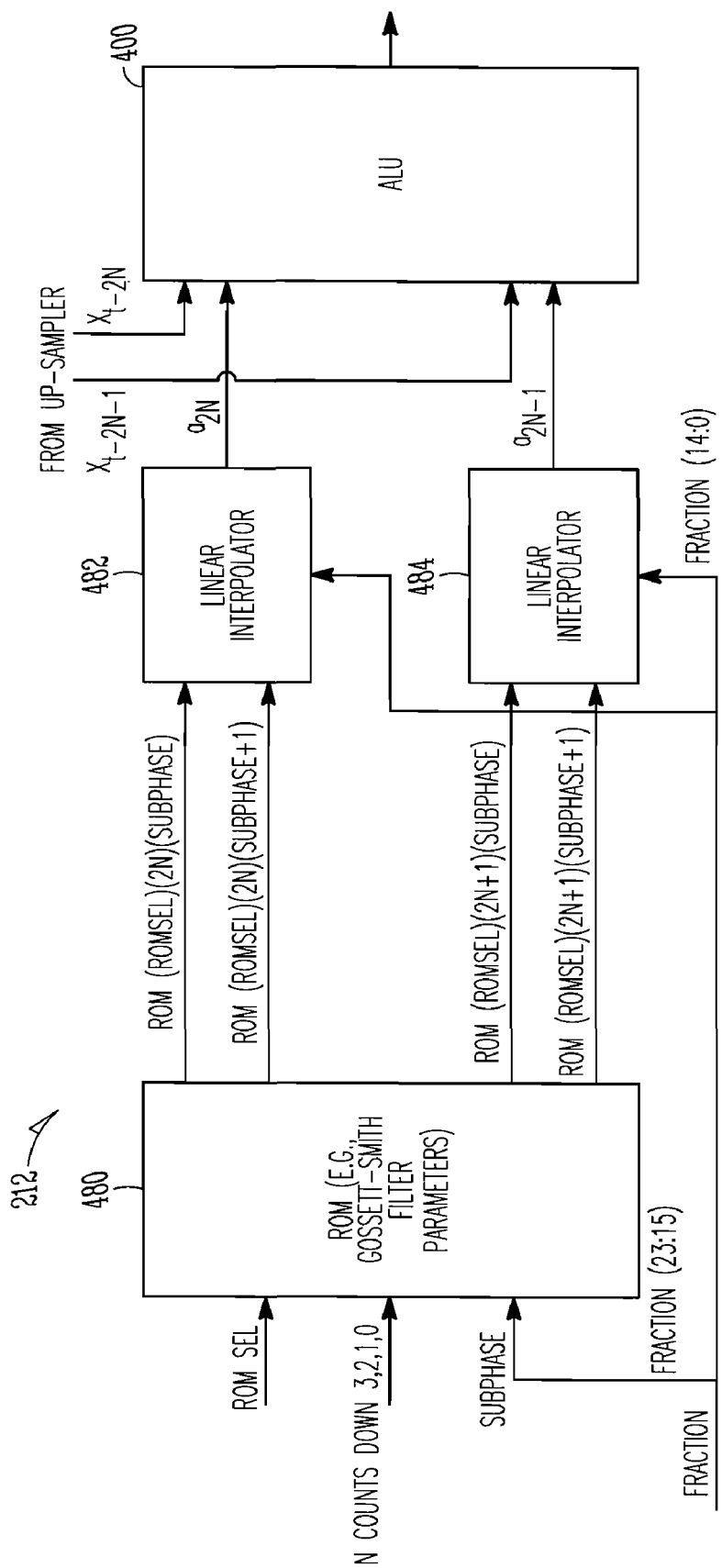
FIG. 21 shows an 8-point interpolator in accordance with an example embodiment.

FIG. 21 shows example details of the 8-point interpolator 212. The interpolator 212 is shown to comprise Read Only Memory (GSROM) 480, first and second linear interpolators 482, 484 and an ALU such as the ALU 400. The GSROM 480 stores filter parameters for the linear interpolators 482, 484. In an example embodiment, the interpolator 212 may implement an 8-point FIR interpolator based on the well-known Gossett-Smith algorithm and, accordingly, Gossett-Smith parameters may be stored in the GSROM 480. The general mathematical equation performed by the interpolator 212 is a convolution operation:

$$\sum_{n=0}^{7} a_n x_{t-n}$$

In order to generate 4 samples within 16 clocks, the interpolator 212 in an example embodiment should complete two multiply-accumulate operations each clock. In addition, the interpolator 212 should calculate two coefficients each clock. An algebraically modified equation accommodates this requirement:

$$\sum_{n=0}^{3} (a_{2n} x_{t-2n} + a_{2n+1} x_{t-2n-1})$$

Each coefficient calculation may require reading two adjacent locations from the GSROM 480, one "even" and one "odd", and linearly interpolating between the two (see linear interpolators 482, 484). The fraction input (the fractional portion of the current address) from the control module 152 may determine both the coefficients to read from the GSROM 480 and the amount to interpolate between them. The most significant bits of the fraction may determine the GSROM 480 locations to read, and the least significant bits determine the linear interpolation amount.

Further, in order to calculate two coefficients each clock, it must read 4 locations from the GSROM 480 each clock. To facilitate this, the GSROM 480 may be split into two separate blocks, each of which delivers two coefficients from a single address. The first GSROM 480 block may be src_gsrom_even (see lines 486), and the second may be src_gsrom_odd (see lines 488). The interpolation module 156 may generates two addresses, an even address corresponding to the "even" coefficient and an odd address corresponding to the "odd" coefficient. The interpolation module 156 may then present these two addresses to the GSROM 480 and, in particular, direct generated addresses to the appropriate block, src_gsrom_even or src_gsrom_odd in the GSROM 280.

Since the up-sampler 210 may deliver two adjacent samples each clock, the interpolator 212 may calculate coefficients from adjacent taps in the GSROM 480. Normally, in an example embodiment the address of an adjacent tap is equal to the current tap address plus the number of sub-phases in the GSROM 480. In an example embodiment, the SRC 150 may use 512 sub-phases. Sub-phases may be discretely calculated filter coefficients corresponding to a coarse (e.g. 9-bit) fractional address. Thus, if the fraction were such that all the bits were zero except the 9 MSBs, then the FIR filter coefficients could be read directly from the ROM with no further computation necessary prior to using them in the interpolation filter. Generally, this may not be the case, so linear interpolation (see linear interpolators 482, 484 may be used to calculate filter coefficients that lie between two sub-phases. Another way to look at it is that the FIR filter coefficients in the GSROM 480 may be at a sample rate equal to 512 times the input sample rate, or generally, the number of sub-phases times the input sample rate. For example, with 512 sub-phases and an input sample rate of 48 kHz, the FIR filter coefficients in the ROM can be considered to have a sample rate of 512*48000, or 24.576 MHz. As stated above, each GSROM 480 may deliver two coefficients from a single address. These two coefficients may belong to adjacent taps, logically separated by 512 addresses (sub-phases). The GSROM 480 may then deliver the data from tap N in the low word and from tap N+1 in the high word. Thus, with two addresses presented to it, the src_gsrom module may deliver 4 coefficients, two from adjacent locations, and two from adjacent taps.

For example, if the even address is 104 and the odd address is 105, the src_gsrom may deliver coefficients from logical locations 104, 105, 616, and 617. The src_gsrom_even module may deliver logical locations 104 and 616 (104+512), and the src_gsrom_odd module may deliver logical locations 105 and 617 (105+512). The coefficient interpolator 212 may interpolate between locations 104 and 105 to calculate the coefficient from the first tap, and between locations 616 and 617 to calculate the coefficient from the second tap.

In an example embodiment, since each of the two ROM's may contain only even or odd coefficients, the addresses presented may not be the full address. Each ROM may not need the LSB. In an example embodiment, each GSROM 480 may receive the same address, 52, which is equal to the logical address (104) divided by two. It is also possible that the first coefficient needed is from an odd address. For example, the even address may be 106 and the odd address may be 105. In this case, the even GSROM 480 may receive address 53 but the odd GSROM 480 may receive address 52. In an example embodiment, it may never be the case that the interpolation module 156 presents an incremented odd address. It is either equal to the even address when the first coefficient is even, or one less than the even address when the first coefficient is odd.

The logical GSROM 480 itself may be symmetric about the center point. Therefore, in an example embodiment it may be redundant to store the full GSROM 480, since each coefficient would be stored twice. To compress the storage necessary, the src_gsrom module may perform address mirroring about the center point. From the point of view of the interpolation module 156, it may store utilizing the entire GSROM 480. In an example embodiment, it only stores the first half of the ROM and mirror the address to produce the same effect as storing the entire ROM. In addition, the ROM may contain an odd number of data points. This may ensure a unique center point and provides the best filtering performance. Since there may be 512 sub-phases and 8 taps, the full ROM may contain 4097 points (512*8+1). The center point may occur on an even address, which may require the src_gsrom_even module have 2049 locations while the src_gsrom_odd module may require 2048 locations. In an example embodiment, because each location may deliver two coefficients, one each from adjacent taps, the src_gsrom_even module may logically have 1024.5 locations and the src_gsrom_odd module may have 1024 locations. Accordingly, the src_gsrom module may store the center point of the ROM separately. Thus, both src_gsrom_even and src_gsrom_odd may have 1024 locations, and the src_gsrom module may detect the center point address and delivers it without reading the GSROM 480.

The address mirroring logic may use the MSB of each address to detect that the second half is selected. The odd address mirroring may be a simple ones-complement operation. The even address mirroring may be a twos-complement operation because the center point is not stored. Due to the address mirroring, each ROM instance may not require the MSB of each address.

In an example embodiment, when the address selects the second half of the ROM and activates the address mirroring logic, it may reverse the sense of adjacent taps. Thus, taps 3-4 in the first half respectively may correspond to taps 6-5 in the second half of the ROM. To make this transparent to the interpolation module 156, the src_gsrom module may swap the high word and low word of the data read from the ROM.

When the two adjacent sub-phases straddle a logical tap boundary, for example the logical odd address is 511 and the logical even address is 512, the data read from the even ROM may not contain the proper taps. Thus, logical even coefficient 512 may be stored in address 0, which contains logical coefficients 0 and 512. But the interpolation module 156 may need logical coefficients 512 and 1024 in this case. To handle conditions such as these, which include the unique center point already discussed, the first locations in each tap may be redundantly stored outside the ROM instances for easy selection by the src_gsrom module.

In an example embodiment, the SRC 150 may support four different coefficient sets, each optimized for different applications. The SRC 150 may call these four coefficient sets ROM0, ROM1, ROM2, and ROM3. All four coefficient sets may be stored in src_gsrom_even and src_gsrom_odd. The most significant two bits of the address may select between ROM0, ROM1, ROM2, and ROM3. The src_gsrom module may receive these two bits via the input port gsrom_select_i, and concatenate them with the even and odd addresses after the mirroring logic to create the actual addresses presented to the even and odd ROM modules.

After reading the 4 coefficients from the src_gsrom module, the interpolator 212 may present them to two coefficient interpolator modules (see linear interpolators 482, 484). Each module may take two of the four coefficients and the LSBs of the fractional address and produces an interpolated coefficient.

The ALU 400 (src_gs4x_alu_1clk module) may contain two multipliers and a 3-input adder. The module may multiply each interpolated coefficient by the corresponding one of the two samples received from the up-sampler 210 and add the results to produce an accumulate output signal. The module may use a single pipeline register, enabling the use of behavioral retiming during synthesis to optimize the timing paths, e.g. the optimize_registers command in Synopsys.

Figure 17:
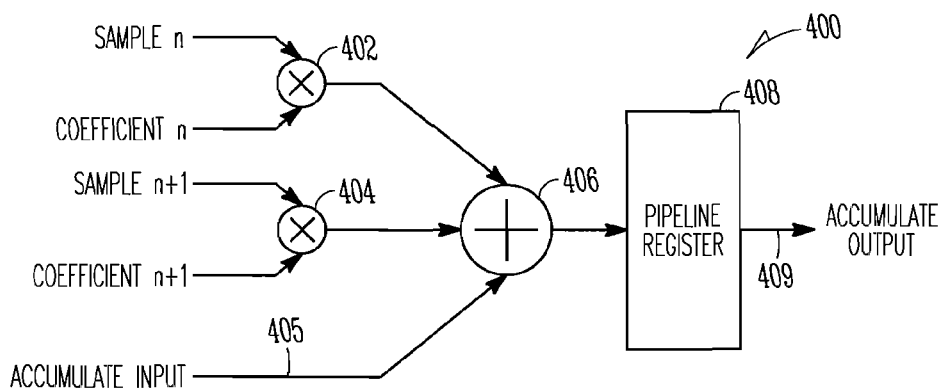
FIG. 17 shows an example Gossett-Smith ALU of the interpolation module shown in FIG. 12.

FIG. 17 shows an example Gossett-Smith ALU 400. The ALU 400 is shown to comprise two multipliers 402, 404 and a summer 406 that feeds a pipeline register 408 to provide an accumulate output 409. The interpolation module 156 may register the accumulate output from the ALU 400 (src_gs4x_alu_1clk module) and feed back the registered value to the accumulate 405 input in order to create a running sum. To initialize the summation, the accumulate input 405 may be forced to zero when performing the first multiplies for each 8-point filtering operation.

In an example embodiment, the entire data path may be highly pipelined, using time-division-multiplexing to operate on four channels simultaneously. Thus, there may be four independent accumulator registers (e.g., gs4x_acc0_q, gs4x_acc1_q, gs4x_acc2_q, and gs4x_acc3_q) in the interpolator 212 (src_gs4x). The interpolator 212 may multiplex these four registers across a 16-clock schedule.

Figure 18:
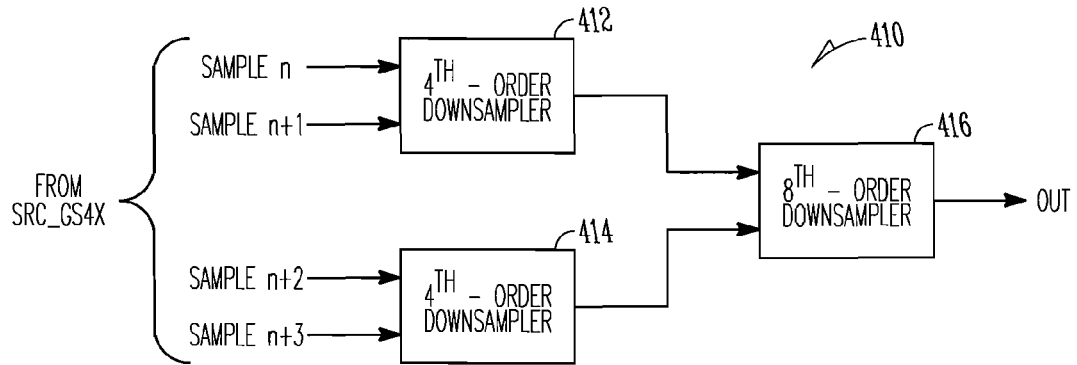
FIG. 18 shows an example logical structure of a SRC down-sampler module in accordance with an example embodiment.

FIG. 18 shows an example logical structure of a SRC down-sample module 410 (src_down) of the SRC 150. The down-sample module 410 is shown to include two $4^{th}$ order down-samplers 412, 414. The down-samplers 412, 414 may each implement a factor-of-4 down-sampler based on two series-connected factor-of-2 down-samplers. The down-samplers 412, 414 may use a $4^{th}$-order QMF. Outputs from the down-samplers 412, 414 are fed into an $8^{th}$ order down-sampler 416 which may use an $8^{th}$-order QMF. In an example embodiment, the QMF is used as a down-sampler and an upper-band output from the generalized QMF band-splitter may be discarded.

Figure 19:
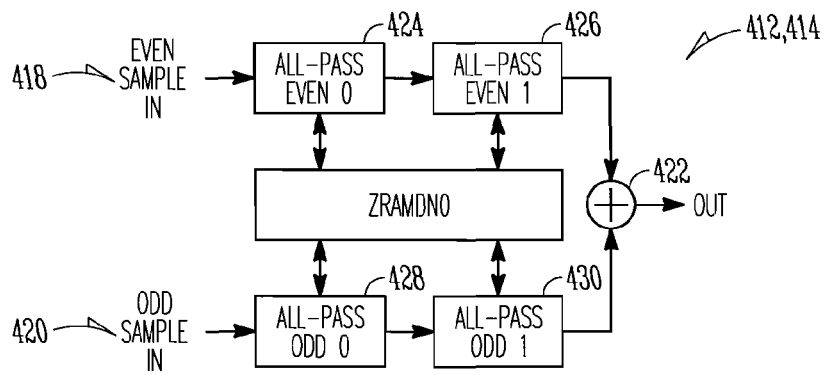
FIG. 19 shows example structure of $4^{th}$ order down-samplers of the SRC down-sampler.

Example structure of the $4^{th}$ order down-samplers 412, 414 is shown in FIG. 19. The down-samplers 412, 414 are shown to include an even sample path 418 and an odd sample path 420 which are summed at summer 422. The even sample path 418 includes two all-pass even filters 424, 426 and the odd sample path 420 includes two all-pass even filters 428, 430.

The inputs to the $4^{th}$-order down-samplers 412, 414 come from the interpolation module 156 (src_gs4x), which may provide 4 samples labeled n through n+3. An "even sample in" port of down-sampler module 410 may be connected to samples n and n+2, and the "odd sample in" port of the down-sampler module may be connected to samples n+1 and n+3.

Figure 20:
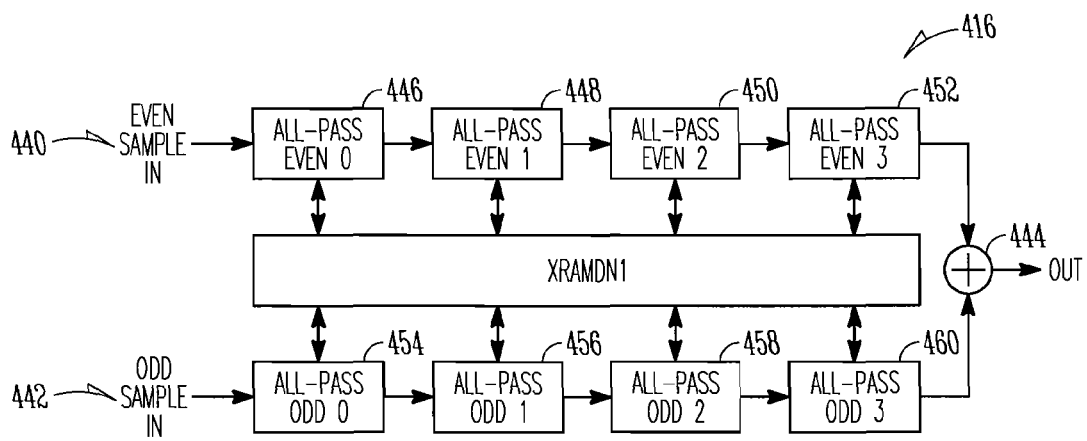
FIG. 20 shows example structure of an $8^{th}$ order down-sampler.

Example structure of the $8^{th}$ order down-sampler 416 is shown in FIG. 20. The $8^{th}$ order down-sampler 416 is shown to include an even sample path 440 and an odd sample path 442 which are summed at a summer 444 top provide a single output. The even sample path 440 includes all-pass filters 446-452 and the odd sample path 442 includes all-pass filters 454-460. Inputs to the $8^{th}$-order down-sampler 416 come from the summers 422 of $4^{th}$-order down-samplers 412, 414 which may each provide single sample to the down-sampler 416. An "even sample in" port of the $8^{th}$-order down-sampler 416 is connected to the first $4^{th}$-order down-sampler 412, which processes samples n and n+1. An "odd sample in" port of the $8^{th}$-order down-sampler 416 is connected to the second $4^{th}$-order down-sampler 414, which processes samples n+2 and n+3.

As in the case of the up-sampler 210 (see FIG. 15), in an example embodiment the all-pass filters 446-460 for the down-sampler 410 may use a 3-add, 1-multiply form, with pipeline registers inserted at each mathematical operation to produce a 3-clock delay from input to output. The number of pipeline registers in each path may ensure proper time-alignment of operands. For example, the two-register path from the input to the subtracter 350 (see FIG. 16) may time-align the input operand with the multiplier output, which in the example embodiment has one register following the input adder and one more following the multiplier (see registers 352). Likewise, the two-register path (see registers 356, 358) from the delay memory ($Z^{-1}$) 360 to an output adder 362 time-aligns the Z-data with the multiplier output.

In an example embodiment, the entire down-sampling operation may require 16 all-pass filters. Since, in an example embodiment, the SRC 150 may process a new channel every 16 clocks, the down-sampler 410 may time-multiplex the all-pass filtering with a single all-pass component, which may reduce the silicon area required when compared with the up-sampler 210.

The down-sampler 410 may require an extra adder, external to the all-pass component in order to produce a lower-band output. A single time-multiplexed adder may suffice, since only 3 operations need to complete in the 16 clocks allocated. The final output of the down-sampler 410 may be a 33-bit signed fixed-point number with 27-bits of fractional precision.

The process of outputting data to the audio ring 164 may be a relatively simple data transfer task. In an example embodiment, it may comprise formatting the output data as 32-bit floating-point and placing the output data on the audio ring 164 at the assigned time slot (see also FIG. 6). In an example normal operational mode, the output data may come from the output of the sample rate conversion operation (see FIG. 12). In an example bypass operation, the data may come directly from the cache module 154.

The output of the sample rate conversion operation (see interpolation module 156 in FIG. 12) may be a 33-bit fixed-point number with 1 sign bit, 5 additional integer bits, and 27 bits of fractional precision. The cache data output (see FIG. 13) may vary depending on the sample format field in the control register located in the CTL RAM 184, and may be one of 4 fixed-point formats that are entirely fractional, or 32-bit IEEE floating point. The 32-bit IEEE floating point data may pass directly through to the audio ring 164 without modification.

In the example bypass mode, the data used may be the same as that which would have been the last data fetched for the sample rate conversion operation. Thus, that no additional RAM bandwidth may be consumed by the bypass data, since the RAM bandwidth may already be reserved for sample rate conversion. In addition, using the last data fetch may minimize the pipeline registers required to hold the data until the audio ring output time slot occurs.

In an example embodiment, a fixed-to-floating-point converter module may format the data as 32-bit IEEE floating point. A multiplexer at the input of a converter module may select between the cache data and sample rate conversion outputs. The cache data output may be sign-extended and zero-padded to align the binary point with the 33-bit fixed-point sample rate conversion data output. This functionality may, for example, be performed in the audio ring interface 158.

The process of outputting data to the audio ring 164 may comprise formatting the output data as 32-bit floating-point data and placing it on the audio ring 164 at the assigned time slot as shown in FIG. 6 (least significant 4 bits of the audio ring channel=1). In an example normal operation, the data may come from the output of the sample rate conversion operation (see FIG. 12). In an example bypass operation, the data may come directly from the cache module 154.

The output of the sample rate conversion operation may be a 33-bit fixed-point number with 1 sign bit, 5 additional integer bits, and 27 bits of fractional precision. The cache data output (see FIG. 13) may vary depending on the sample format field in the control register located in the CTL RAM 184, and may be one of 4 fixed-point formats that are entirely fractional, or 32-bit IEEE floating point. The 32-bit IEEE floating point data may pass directly through to the audio ring 164 without modification.

In the example bypass mode, the data used may be the same as that which would have been the last data fetched for the sample rate conversion operation. Thus, no additional RAM bandwidth may be consumed by the bypass data, since the RAM bandwidth may already have been reserved for sample rate conversion. In addition, using the last data fetch may minimize the pipeline registers required to hold the data until the audio ring output time slot occurs.

In an example embodiment, a fixed-to-floating-point converter module may format the data as 32-bit IEEE floating point. A multiplexer at the input of the converter module may select between the cache data and sample rate conversion outputs. The cache data output may sign-extended and zero-padded to align the binary point with the 33-bit fixed-point sample rate conversion data output. This functionality may, for example, be performed in the audio ring interface 158.

In an example embodiment, an audio ring input mapper may select the data from the audio ring 164 to write to the cache module 154, and indicate to the cache module 154 which SRC channel should receive the data. The data on the audio ring 164 may be in a 32-bit IEEE floating-point. A sample format field in the control register provided in the CTL RAM 184 may determine the format of the data written to the cache module 154.

A floating-to-fixed-point converter module may format the data as 32-bit fixed-point with 1 sign bit and 31 fractional bits. The most significant N bits may be selected for writing to the cache depending on the sample format. Here, the value of N may be 8, 16, 24, or 32.

In the case of 8-bit formats, the sign bit may inverted to convert to an unsigned number. In the case of 32-bit IEEE floating-point sample format, the data from audio ring 164 may pass through to the cache module 154 without modification.

An audio ring data input operation may occur simultaneously with data transfer on the transport ring 162. In an example embodiment, transport ring data transfers may receive priority for shared resources. The audio ring access logic 242 may use FIFOs to hold off audio ring access to shared resources until the transport ring 162 can relinquish control.

The cache module 154 may send and receive 32-bit data to and from the transport ring 162. In an example embodiment, unlike audio ring data transfer, the transport ring may operation may ignore the sample format field of the control register, since it may assume the data is already formatted.

The cache write address (CWA) may control a starting byte position of the data to be written to the cache module 154. This may require byte lane steering logic.

The audio ring byte lane steering may be simpler than the transport, since it need not have to account for a source byte address. In an example embodiment, audio ring byte lane steering logic may be dependent upon the least significant 2 bits of CWA, as shown by way of example in the following table.

TABLE 1

Example Audio Ring Input Byte Lane Steering

|  | Cache Byte | | | |
| --- | --- | --- | --- | --- |
| CWA(1:0) | 3 | 2 | 1 | 0 |
| 00 | 3 | 2 | 1 | 0 |
| 01 | 2 | 1 | 0 | 3+ |
| 10 | 1 | 0 | 3+ | 2+ |
| 11 | 0 | 3+ | 2+ | 1+ |

In this table, the left column indicates the binary value of the LS 2 bits of CWA. The cache byte columns indicate the byte position in the cache where the data will be written. The contents of the table indicate the source byte. For example, when CWA(1:0)=01, byte 2 of the formatted audio ring input data will be written to byte 3 in the cache. The '+' following the source byte number indicates to increment the address.

The transport ring byte lane steering may be more complex because the source byte address may not be aligned on a 32-bit boundary. This may only be an issue for the first data element in a single burst, since the source address must increment by the number of bytes actually written, which causes the source address to be aligned starting with the second data element in a burst.

The source byte address for the first data element in the burst may be equal to the request address (RA). The byte lane steering may be dependent on both the least significant 2 bits of CWA and least significant 2 bits of RA, as shown by way of example in the following table.

TABLE 2

Transport Ring Input Byte Lane Steering

| | | Cache Byte | | | |
|---|---|---|---|---|---|
| RA(1:0) | CWA(1:0) | 3 | 2 | 1 | 0 |
| 00 | 00 | 3 | 2 | 1 | 0 |
|  | 01 | 2 | 1 | 0 | 3+ |
|  | 10 | 1 | 0 | 3+ | 2+ |
|  | 11 | 0 | 3+ | 2+ | 1+ |
| 01 | 00 | — | 3 | 2 | 1 |
|  | 01 | 3 | 2 | 1 | — |
|  | 10 | 2 | 1 | — | 3+ |
|  | 11 | 1 | — | 3+ | 2+ |
| 10 | 00 | — | — | 3 | 2 |
|  | 01 | — | 3 | 2 | — |
|  | 10 | 3 | 2 | — | — |
|  | 11 | 2 | — | — | 3+ |
| 11 | 00 | — | — | — | 3 |
|  | 01 | — | — | 3 | — |
|  | 10 | — | 3 | — | — |
|  | 11 | 3 | — | — | — |

In this example table, the left column indicates the binary values of the LS 2 bits of both RA and CWA. The cache byte columns indicate the byte position in the cache where the data will be written. The contents of the table indicate the source byte. For example, when RA(1:0)=01 and CWA(1:0)=10, byte 2 of the formatted audio ring input data will be written to byte 1 in the cache. The '+' following the source byte number indicates to increment the address. The '−' in place of the source byte number indicates do-not-write.

The cache control register (CCR) 236 (see FIG. 13) may hold information needed to perform cache data transfers, such as the CWA and RA fields, as well as the cache invalid size (CISZ) and request state (RS) fields. In addition to using the information, the data transfer operation should update the fields as the transfer occurs.

In the simpler case of audio ring data input, the CWA and CISZ fields may update as each sample is written to the cache module 154. The CWA may increment by the sample size, and the CISZ may decrement by the same amount. In an example embodiment, the transport ring data transfer operation should also update RA after the first data element in a burst, and update the RS field after the last data element in a burst.

To accommodate simultaneous transfers to and from the transport ring 162 and audio ring 164, while compensating for RAM access latency, in an example embodiment the CCR shadow logic (see Shadow Match Logic 230 in FIG. 13) may maintain copies of 8 SRC channels' CCR registers. A least-recently-used (LRU) algorithm may determine which of the 8 CCR shadow locations will be overwritten when a new data transfer begins on a channel that is not already shadowed. A one-hot matching system may determine which of the 8 locations has a data transfer on any particular clock cycle.

The CCR shadow logic may update the CWA, CISZ, RA, and RS fields during data transfer operations. When the matching logic indicates a data transfer, the shadow logic may calculate a transfer byte count. During cache write (input) operations, the CWA field may increment by the byte count and the CISZ field may decrement by the byte count. For a transport ring output transfer (cache read), the CWA field may not change, but the CISZ field may be increment by the byte count.

In the case of an audio ring input, the byte count may depend on the sample format in the control register, as shown by way of example in the following table.

TABLE 3

Audio Ring Input Byte Count

| byte count | format |
|---|---|
| 1 | FIXED8 |
| 2 | FIXED16 |
| 3 | FIXED24 |
| 4 | FIXED32 |
| 4 | FLOAT |

In the case of transport ring input, the byte count may depend on the RA and CISZ fields. In general, the byte count may be equal to (4−RA). This may ensure that only the selected bytes from the first data element are written. When CISZ is less than 4, the byte count may be generally equal to CISZ. This may ensure that only the selected bytes from the last data element are written. However, when CISZ is less than 4 and the sum of (CISZ+RA) is greater than 4, then the byte count may equal to (4−RA).

In an example embodiment, the CCR shadow logic should also maintain copies of the SRC control registers, in order to know the sample format for audio ring input, and to know the reference sample rate (RSR) and interleave size (ILSZ) for cache address calculation.

Since the data transfer operations may occur any time, in an example embodiment the sample rate conversion operation uses the shadowed copies of the CCR registers in order to maintain a coherent state for each channel. The CCR shadow logic may accommodate this by updating CISZ according to the information provided by the SRC control logic. It may also update RS and RA when new requests are submitted to the transport ring.

The RS field may generally update on the last data transfer in a transport burst. In an example embodiment, an exception is that the LOOP_SA may always transition to LOOP_LA even if it is not the last data transfer. The state transitions may be as follows:

TABLE 4

Transport Ring Request State Transitions

| RS | New RS |
|---|---|
| AUDIO_RD | NO_REQUEST |
| AUDIO_WR | NO_REQUEST |
| LOOP_RD | LOOP_SA if auto-load else LOOP_DONE |
| LOOP_WR | NO_REQUEST |
| LOOP_SA | LOOP_LA |
| LOOP_LA | LOOP_DONE |
| NO_REQUEST | NO_REQUEST |

In an example embodiment, central to the algorithm is an array of one-hot vectors. The bit that may be set in each vector may represents the shadow location. For example, if bit 2 is set, it represents shadow location 2.

Since there may be 8 shadow locations, there may be 8 locations in the LRU array, indexed as 0 through 7. Index 7 generally indicates the LRU shadow, but in certain cases, indices 5 or 6 indicate the LRU shadow. Index 0 indicates the most recently used (MRU) shadow.

The LRU array may update each time a data transfer occurs on one of the shadow locations. When a data transfer occurs, the LRU array may be searched to find the matching one-hot vector that represents the shadow location. The matching location may be moved to the MRU location, index 0, and all intervening locations may be shifted up. The effect of this may be that the LRU array becomes sorted according to the time since the last usage, with index 0 being the most recent and index 7 being the least recent. Assuming this was the LRU shadow, it may be immediately promoted to the MRU shadow and index 6 is moved to index 7, becoming the new LRU.

In an example embodiment, a circumstance may occur when more than one data transfer occurs simultaneously, or when one or more data transfers occur at the same time as a new transfer begins for a channel that is not yet shadowed. If a data transfer occurs on the LRU shadow (index 7), then the LRU array may not be updated yet, because of the pipeline delay of registers. In this case, index 6 may be the effective LRU.

Further, it may be possible for two simultaneous data transfers, one audio ring 164 and one transport ring 162, to occur on different shadows. If one of these occurs on the LRU shadow (index 7) and the other at the next LRU (index 6), then index 5 may be the effective LRU.

In these example cases, more than one LRU array element would be promoted to MRU. However, there may be only one MRU location, so priority may be given to the transport ring 162, then to the audio ring 164, then to the newly updated shadow register. Thus, for example, if both the transport ring 162 and audio ring 164 have data transfers occurring simultaneously on different shadows, then the LRU array element matching the transport ring data transfer may move to index 0 (MRU), and the element matching the audio ring data transfer will move to index 1. In an example embodiment, from the perspective of the LRU matching algorithm, the start of a new data transfer may be two clocks before the actual data transfer occurs. In an example embodiment, the LRU array should be updated to put the newly updated shadow location in the MRU location even though data transfer has not yet occurred in order to protect the location from being falsely detected as LRU before it is actually used.

In an example embodiment, requests presented to the transport ring 162 may be dropped in favor of more urgent requests. In response to dropped requests, the cache module 154 may set a Dropped bit in the CCR RAM 246 to indicate that a previously generated request was dropped. In an example embodiment, in order to provide more accurate request generation, the cache module 154 may alternatively change a Request State field to NO_REQUEST, forcing re-evaluation of the request conditions. This may be appropriate for normal operation, when loop processing is not active. At loops however, e.g. in the LOOP_RD or LOOP_SA states, the Dropped bit may be used since the control module 152 may not generate the crossed_loop_flag again. Thus, the condition Dropped+a loop request state may serve as an indirect memory of the crossed_loop_flag.

The cache module 154 may generate transport read requests when needed, generally when CISZ is greater than or equal to 32. However, this is an arbitrary number chosen to bias the size of the requests to be generally 8 DWORDS or more. In an example embodiment, this threshold may be programmable by software.

At loop points, indicated by the crossed_loop_flag, the cache module 154 may generate transport read requests independent of the value of CISZ. Instead, the cache module may generate a request to read the sample data up to the end of the loop.

Since the transport ring may support only DWords transfers, the value of CISZ may be generally truncated to the next lower number of DWords when generating a read request. For example, if CISZ is 33 (bytes), the transport request size will be 8 (DWords).

However, the value may not be truncated at loop points to ensure that all bytes up to the end of the loop, indicated by the tr_req_loop_rd_size signal, are transferred. Example embodiments may require incrementing the number of Dwords transferred at loop points. In an example embodiment the size is incremented by 1, and in others it is be incremented by 2.

If the least significant 2 bits of tr_req_loop_rd_size are non-zero, then the request size may be incremented by at least one. For example, if tr_req_loop_rd_size is 3, then the truncated request size may be zero. This may cause the 3 bytes to not be fetched. Thus, since in an example embodiment the size may be incremented when the LS 2-bits are non-zero, the request size may be 1 Dword and the 3 bytes may be fetched.

Likewise, if the least significant 2 bits of the request byte address are non-zero, then the size may be incremented by at least one. For example, if the request byte address is 0x401 and tr_req_loop_rd_size is 4, then the truncated request size may be 1 (DWord). In this example embodiment, it may fetch the single DWord at address 0x400, but only 3 bytes from that DWord are needed, those from 0x401-0x403. Thus, since the size may be incremented when the LS 2 bits of the address are non-zero, the request size will be 2 DWords, and the $4^{th}$ byte at address 0x404 will be fetched.

If the sum of the LS 2 bits of tr_req_loop_rd_size and the LS 2 bits of the request byte address is greater than or equal to 5, then the size may be incremented by two rather than one. For example, if tr_req_loop_rd_size is 3 and the request byte address is 0x802, incrementing the truncated request size by 1 will only fetch a single DWord at address 0x800. However, only the 2 bytes at addresses 0x802-0x803 are needed. The third byte required is from address 0x804, so the request size must be incremented by 2 in order to get all the required bytes. The transport request address is equal to CA minus CISZ.

A transport bus request protocol may require a time budget, which a transport engine may use to prioritize the requests to ensure that the most urgent requests will be serviced first. The time budget may be in units of sample periods.

In the case of audio read requests by the SRC 150, the time budget may equal to the cache valid size (CVSZ) minus the minimum bytes required for a single conversion divided by the pitch in bytes:

(CVSZ−MIN_BYTES)/PITCH_IN_BYTES

In an example embodiment, this expression indicates the number of sample periods that the SRC 150 can continue to produce correct sample output without receiving new data from the transport ring 162. The value of CVSZ may be given byte the per-channel cache size (MAX_CISZ) minus CISZ:

CVSZ=MAX_CISZ−CISZ.

The minimum samples required for a single conversion may be equal to 4+ceiling (PITCH) to provide correct results. Thus, if the pitch is less than or equal to 1.0, the minimum samples required may be 5. In an example embodiment, this is multiplied by the bytes per sample and the interleave factor to derive the minimum bytes required. For example, if the sample format is FIXED24 with interleave factor 2 and the pitch is 1.1, then the minimum bytes required is 36:

MIN_BYTES=(4+ceiling(1.1))*3*2=36

At loop points there may be a residual of CISZ that should also be fetched in order to make the time budget valid. In an example embodiment, the cache module 154 may calculate the time budget as though it were not a loop, then uses the value divided in half as the time budget. Thus, some loop requests may have a more aggressive time budget than necessary, and others may not have an aggressive enough time budget.

In the case of audio write requests by the SRC 150, the same expression may be used, substituting CISZ for (CVSZ– MIN_BYTES). In an example embodiment, the pitch value may forced to a value of 1.0, since the pitch parameter may be ignored for SRC write channels in order to allow CA to remain static during regular channel processing time.

In an example embodiment, results are "warped" to compensate for the errors, making the result closer to ideal. The logic may calculate a 6-bit warp factor that is multiplied by the bit-shifted numerator to create a close approximation of a divider. The warp factor may range in value from 0.5 up to 1.0 using 5 bits of fractional precision and a single integer bit. In an example embodiment, there may be 12 discrete values of warp factor in this range, selected using a 4-bit index called the pitch_warp_bits, as follows:

| pitch_warp_bits | warp_factor |
|---|---|
| 0 | 1 |
| 1 | 0.90625 |
| 2 | 0.875 |
| 3 | 0.8125 |
| 4 | 0.78125 |
| 5 | 0.71875 |
| 6 | 0.71875 |
| 7 | 0.65625 |
| 8 | 0.65625 |
| 9 | 0.625 |
| 10 | 0.59375 |
| 11 | 0.5625 |
| 12 | 0.5625 |
| 13 | 0.53125 |
| 14 | 0.53125 |
| 15 | 0.5 |

The bits of pitch immediately below the leading "1" (the most significant bit that is set) in the pitch input may be used as the MS 3 bits of pitch_warp_bits, a 4-bit index into a lookup table of warp factors. The LS bit of pitch_warp_bits may be calculated as a bit-wise OR of the pitch bits below the 3 bits selected as part of the index. This may effectively round up the result if the lower order bits of the pitch are non-zero.

The pseudo-divide operation may then be summarized as follows:

$$((CVSZ-MIN\_BYTES) >> \log 2(PITCH)) * warp\_factor$$

The cache module 154 may generate write requests when needed, generally when CVSZ is greater than or equal to 32. However, in an example embodiment, this may be an arbitrary number chosen to bias the size of the requests to be generally 8 DWords or more. This threshold may be programmable by software.

Unlike read requests, the request address may equal to CA. Thus, in an example embodiment, special handling at loop points is limited to clamping the size of the request to prevent writing beyond the end of the loop.

Unlike read requests, whole DWords may always be transferred, so the start address is always DWord-aligned.

During transport write data transfers, the cache module 154 may increment CA by 4 bytes as each DWord moves out of the cache RAM 248. At the end of the transport write data transfer, CA is written back to the address RAM 186.

In an example embodiment the SRC 150 may automatically load a new pair of loop addresses, SA and LA, at the end of each loop. This feature is referred to herein as "auto-load" (see Run_AUTO_LOAD state 310 in FIG. 14). The auto-load feature may use a list of SA:LA pairs located in sound memory. For example, the sound memory may be SDRAM or host memory in which audio samples reside and be accessed via the transport ring 162. Each channel may have a next-auto-load field (NAL) in the Cache Control Register (CCR). At each loop point, if the channel is in auto-load mode, the cache module 154 may read a new SA:LA pair from sound memory using NAL as an index into the auto-load list for the channel.

The auto-load list for each channel can be either 8 elements or 32 elements, depending on the value of the auto-load size bit in the SRC Master Control register. If the auto-load size bit is equal to 0, then each channel's auto-load list consists of 8 elements. If it is equal to 1, then each channel's auto-load list consists of 32 elements.

An auto-load operation may be triggered after the last data transfer at the end of a loop has completed when the channel is in either the INIT_AUTO_LOAD state 306 or RUN_AUTO_LOAD state 310. In an example embodiment, this may imply a different mechanism for playback (read) channels versus record (write) channels.

As described above by way of example in the Transport Ring Request State Transitions, the LOOP_SA state may correspond to the state in which the auto-load operation is waiting for the first DWord of the SA:LA pair.

For playback (read) channels, the state transition to LOOP_SA may occur upon completion of a LOOP_RD request without generating a new transport request. To initiate the transport request, the cache module 154 may set the Dropped bit in the CCR when the state transition to LOOP_SA occurs. When the next channel processing time occurs, the Dropped bit forces the generation of a transport read request for the SA:LA pair.

For record (write) channels, when the crossed_loop_flag signal is set by the control module 152, this may indicate the completion of data transfer at the loop point, causing a transport read request for the SA:LA pair to be generated.

The time budget for auto-load requests may use a constant value of 2 sample periods. In an example embodiment, the time budget for auto-load requests may take into account the actual time remaining before an audio defect occurs, allowing the transport ring to properly prioritize the requests.

Thus, method and device to perform sample rate conversion have been described. Although the present invention has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A sample rate converter comprising:
   an interpolation module to calculate new digital samples for insertion into a digital sample ring;
   a cache module to provide input digital samples of a digital sample stream to the interpolation module; and a control module to maintain and to provide state information to the interpolation module and the cache module, wherein based on pitch parameters the control module provides the interpolation module a fractional portion of an address for use in calculating the new digital samples and provides the cache module with an integer portion of the address and an address increment.

2. The sample rate converter of claim 1 wherein the control module comprises:

pitch registers to store the pitch parameters received from a parameter ring; and a loop detector to determine when a last sample in a loop is played, wherein the control module withholds an interrupt generated by the loop detector until a playback address has crossed the loop plus an additional time of a size of a cache memory and a group delay of interpolation filters of the interpolation module.

3. The sample rate converter of claim 1 wherein the interpolation module comprises:

an upsampler to upsample the digital sample provided by the cache module;

a multipoint interpolator to perform a multipoint interpolation on the upsampled samples provided by the upsampler; and an odd cache to store an odd numbered sample received from the upsampler, wherein the odd cache provides the odd number sample to the multipoint interpolator depending on the fraction portion for further use in performing the multipoint interpolation.

4. The sample rate converter of claim 3 wherein the upsampler comprises:

polyphase filter banks having differing phase shifts to provide an even numbered sample and the odd numbered sample to the multipoint interpolator, wherein the upsampler selects a starting sample based on the fractional portion of the address and repeats providing a same set of samples to the multipoint interpolator on successive iterations when the address associated with the selected starting sample does not change, and wherein the polyphase filter banks comprise either all-pass filters or have an infinite impulse response (IIR) structure.

5. The sample rate converter of claim 3 wherein the multipoint interpolator comprises:

linear interpolators; and a read-only-memory (ROM) to store filter coefficients for the linear interpolators; and an arithmetic logic unit to generate an accumulated output from outputs of the linear interpolators, wherein the fractional part of the address provided by the control module determines coefficients to read from the ROM and an amount to interpolate between the coefficients, and wherein the ROM comprises two separate blocks to deliver two coefficients from a single address for each of the linear interpolators.

6. The sample rate converter of claim 3 wherein the interpolation module further comprises one or more down-samplers to downsample interpolated samples provided by the multipoint interpolator to generate the new digital samples for insertion into the digital sample ring.

7. The sample rate converter of claim 1 wherein the cache module comprises:

an interpolation process controller;

shadow registers to store a current copy of a cache control register (CCR);

shadow match logic to receive the input digital samples from the digital sample ring and to determine if the current copy of the CCR is held in the shadow registers; and shadow update logic for use by the shadow match logic in fetching a current copy of the CCR to update the shadow registers when the current copy of the CCR is not stored in the shadow registers, wherein the shadow match logic produces selectors for use by the interpolation process controller.

8. The sample rate converter of claim 7 wherein the cache module further comprises:

a CCR memory; and a CCR shadow write FIFO, wherein the shadow update logic is to read a CCR from either the CCR memory or the CCR shadow write FIFO and is to insert the CCR into the shadow registers to cause a least recently used shadow to be inserted into the CCR shadow write FIFO for a subsequent write back to the CCR memory.

9. The sample rate converter of claim 7 wherein the cache module further comprises:

a cache memory to provide the input digital samples to the interpolation module under direction of the interpolation process controller; and a plurality of first-in first-out/multiplexers (FIFO/MUXs) to control access to the cache memory.

10. The sample rate converter of claim 1 wherein the sample rate converter is to convert a digital data stream from an input sample rate to an output sample rate, wherein the control module causes the sample rate converter to operate in either a fixed output mode or a variable output mode, wherein during the variable output mode, the output sample rate is variable according to pitch and the input sample is fixed at a reference sample rate (RSR), wherein during the fixed output mode, the input sample rate is variable according to pitch, and wherein the RSR is a fixed power-of-two multiple of a chip master sample rate.

11. The sample rate converter of claim 10 wherein during the variable output mode, a variable pitch parameter determines an amount of a fractional sample address that is to be incremented each sample period to produce pitch variation, and wherein the variable pitch parameter indicates a ratio of the input sample rate to the output sample rate.

12. The sample rate converter of claim 1 wherein the control module comprises a state machine having a plurality of states comprising:

an initialization state to initialize state variables of interpolation filters of the interpolation module and to pre-load initial samples into a cache memory of the cache module;

a run state; and a tail state to transition to a stopping state when a loop flag is set, wherein the state machine transitions from the initialization state to the run state when the cache memory has at least a predetermined number of samples stored therein to begin performing sample rate conversion, the cache memory being less that full when the predetermined number of samples is stored therein, wherein the state machine transitions to the tail state when a channel is playing a back-end of a loop, and wherein the interpolation filters are configured to settle during the stopping state.

13. A method to perform sample rate conversion comprising:

calculating new digital samples using a fractional portion of an address for insertion into a digital sample ring; and determining the fractional portion based on pitch parameters;

wherein calculating the new digital samples comprises:

upsampling the digital samples;

storing an odd numbered sample from the upsampling;

performing a multipoint interpolation on the upsampled samples; and providing, depending on the fractional portion, the odd numbered sample for use in the multipoint interpolation.

14. The method of claim 13 further comprising:

providing, based on pitch parameters received from a parameter ring, the fractional portion for use in calculating the new digital samples;

determining, with a loop detector, when a last sample in a loop is played; and withholding an interrupt generated by the loop detector until a playback address has crossed the loop plus an additional time of a size of a cache memory and a group delay of interpolation filters.

15. The method of claim 14 wherein the upsampling comprises:

providing an even numbered sample and the odd numbered sample to the multipoint interpolation with polyphase filter banks having differing phase shifts;

selecting a starting sample based on the fractional portion of the address; and repeating providing a same set of samples to the multipoint interpolation on successive iterations when the address associated with the selected starting sample does not change, wherein the polyphase filter banks comprise either all-pass filters or have an infinite impulse response (IIR) structure.

16. The method of claim 13 wherein when performing the multipoint interpolation, the fractional part of the address determines coefficients to read from a memory and an amount to interpolate between the coefficients, and wherein the memory comprises two separate blocks to deliver two coefficients from a single address for each linear interpolation.

17. The method of claim 13 further comprising downsampling interpolated samples provided by the multipoint interpolation to generate the new digital samples for insertion into the digital sample ring.

18. The method of claim 13 further comprising:

receiving the input digital samples from the digital sample ring and determining if the current copy of a cache control register (CCR) is held in shadow registers; and fetching a current copy of the CCR to update the shadow registers when the current copy of the CCR is not stored in the shadow registers.

19. The method of claim 13 a digital data stream is converted from an input sample rate to an output sample rate, wherein the method further comprises operating in either a fixed output mode or a variable output mode, wherein during the variable output mode, the output sample rate is variable according to pitch and the input sample is fixed at a reference sample rate (RSR), wherein during the fixed output mode, the input sample rate is variable according to pitch, and wherein the RSR is a fixed power-of-two multiple of a chip master sample rate.

20. A computer-readable medium that stores instructions for execution by one or more processors to perform operations comprising:

calculating new digital samples using a fractional portion of an address for insertion into a digital sample ring; and determining the fractional portion based on pitch parameters;

wherein calculating the new digital samples comprises:

upsampling the digital samples provided by a cache module;

storing an odd numbered sample from the upsampling;

performing a multipoint interpolation on upsampled samples; and providing, depending on the fractional portion, the odd numbered sample for use in the multipoint interpolation.

* * * * *

UNITED STATES PATENT AND TRADEMARK OFFICE
CERTIFICATE OF CORRECTION

PATENT NO. : 7,489,259 B2 Page 1 of 1
APPLICATION NO. : 11/832258
DATED : February 10, 2009
INVENTOR(S) : Thomas C. Savell It is certified that error appears in the above-identified patent and that said Letters Patent is hereby corrected as shown below:

In column 23, line 10, delete " $\sum_{n-0}^{7} a_n x_{i-n}$ " and insert -- $\sum_{n=0}^{7} a_n x_{i-n}$ --, therefor.

In column 23, line 20, delete " $\sum_{n=0}^{3} (a_{2n} x_{i-2n} + a_{2n-1} x_{i-2n-1})$ " and insert -- $\sum_{n=0}^{3} (a_{2n} x_{i-2n} + a_{2n+1} x_{i-2n-1})$ --, therefor.

In column 36, line 66, in Claim 12, delete "less that" and insert -- less than --, therefor.

In column 38, line 17, in Claim 19, delete "claim 13 a digital" and insert -- claim 13 wherein a digital --, therefor.

Signed and Sealed this

Seventh Day of April, 2009

JOHN DOLL
*Acting Director of the United States Patent and Trademark Office*